(12) United States Patent
Inokuchi et al.

(10) Patent No.: US 8,618,590 B2
(45) Date of Patent: Dec. 31, 2013

(54) SPIN TRANSISTOR, INTEGRATED CIRCUIT, AND MAGNETIC MEMORY

(75) Inventors: Tomoaki Inokuchi, Kawasaki (JP); Takao Marukame, Fuchu (JP); Mizue Ishikawa, Yokohama (JP); Hideyuki Sugiyama, Kawasaki (JP); Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1133 days.

(21) Appl. No.: 12/561,475

(22) Filed: Sep. 17, 2009

(65) Prior Publication Data

US 2010/0072528 A1    Mar. 25, 2010

(30) Foreign Application Priority Data

Sep. 24, 2008    (JP) ................. 2008-244760

(51) Int. Cl.
*H01L 21/02*    (2006.01)
*G11C 11/14*    (2006.01)

(52) U.S. Cl.
USPC ............... 257/295; 257/421; 257/E29.323; 365/171; 365/173

(58) Field of Classification Search
USPC ......... 257/295, E29.164, E29.165, 288, 421, 257/E29.323; 365/171, 173
See application file for complete search history.

(56) References Cited

U.S. PATENT DOCUMENTS

| | | | |
|---|---|---|---|
| 7,602,636 B2 * | 10/2009 | Saito et al. | ............ 365/158 |
| 2007/0164336 A1 | 7/2007 | Saito et al. | |
| 2007/0253120 A1 | 11/2007 | Saito et al. | |
| 2008/0061332 A1 | 3/2008 | Saito et al. | |
| 2008/0217711 A1 | 9/2008 | Sugiyama et al. | |
| 2008/0239930 A1 | 10/2008 | Saito et al. | |
| 2009/0050948 A1 | 2/2009 | Ishikawa et al. | |
| 2009/0057654 A1 | 3/2009 | Saito et al. | |
| 2009/0059659 A1 | 3/2009 | Inokuchi et al. | |
| 2009/0179667 A1 | 7/2009 | Sugiyama et al. | |
| 2009/0180215 A1 | 7/2009 | Ishikawa et al. | |
| 2009/0200592 A1 | 8/2009 | Tsuchiaki et al. | |

FOREIGN PATENT DOCUMENTS

| | | |
|---|---|---|
| JP | 2006-32915 | 2/2006 |
| JP | 2006-261353 | 9/2006 |
| JP | 2007-194300 | 8/2007 |
| JP | 2008-4891 | 1/2008 |
| WO | WO 2004/079827 A1 | 9/2004 |

OTHER PUBLICATIONS

U.S. Appl. No. 12/565,303, filed Sep. 23, 2009, Marukame, et al.

(Continued)

*Primary Examiner* — Kenneth Parker
*Assistant Examiner* — Jose R Diaz
(74) *Attorney, Agent, or Firm* — Oblon, Spivak, McClelland, Maier & Neustadt, L.L.P.

(57) ABSTRACT

A spin transistor includes a first ferromagnetic layer, a second ferromagnetic layer, a semiconductor layer between the first and second ferromagnetic layers, and a gate electrode on or above a surface of the semiconductor layer, the surface being between the first and second ferromagnetic layers. The first ferromagnetic layer comprises a ferromagnet which has a first minority spin band located at a high energy side and a second minority spin band located at a low energy side, and has a Fermi level in an area of the high energy side higher than a middle of a gap between the first and second minority spin bands.

11 Claims, 16 Drawing Sheets

(56) References Cited

OTHER PUBLICATIONS

Benjamin Balke, et al., "Properties of the quaternary half-metal-type Heusler alloy $Co_2Mn_{1-x}Fe_xSi$", Physical Review B 74, 104405 (2006), pp. 104405-1-104405-10.

Satoshi Sugahara, et al., "A spin metal-oxide-semiconductor field-effect transistor using half-metallic-ferromagnet contacts for the source and drain", Applied Physics Letters, vol. 84, No. 13, Mar. 29, 2004, pp. 2307-2309.

Gerhard H. Fecher, et al., "Substituting the main group element in cobalt-iron based Heusler alloys: $Co_2FeAl_{1-x}Si_x$", Journal of Physics D: Applied Physics 40 (2007), pp. 1582-1586.

I Galanakis, "Appearance of half-metallicity in the quaternary Heusler alloys", Journal of Physics: Condensed Matter 16 (2004), pp. 3089-3096.

Office Action issued Sep. 21, 2010 in Japanese Patent Application No. 2008-244760 (with English translation).

* cited by examiner

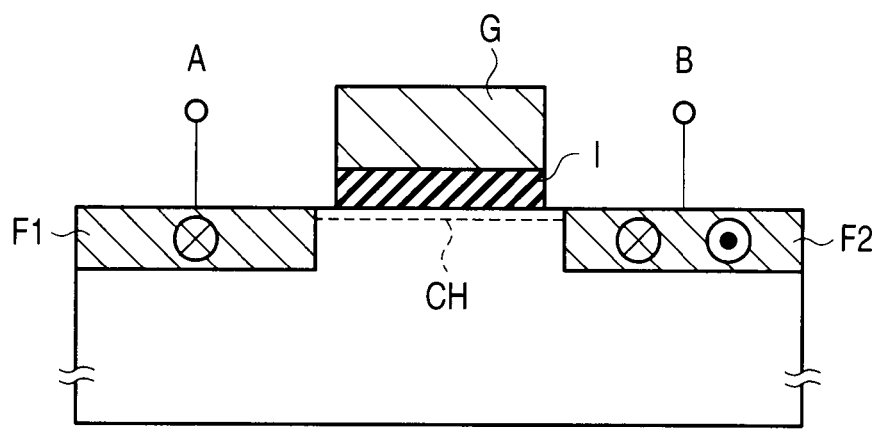
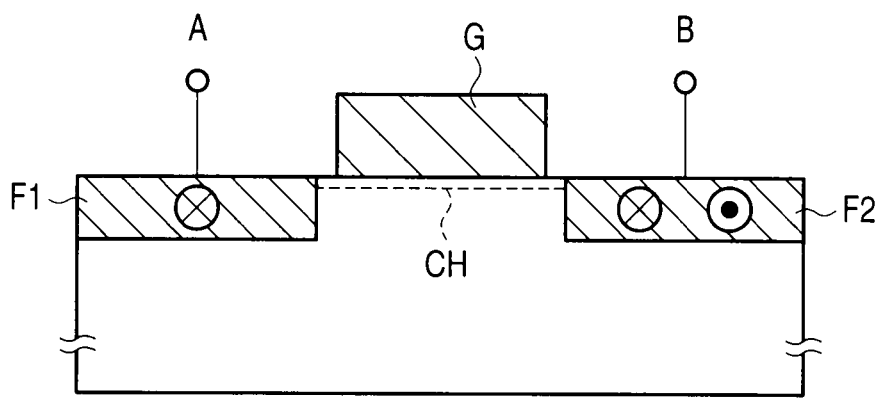
FIG. 4

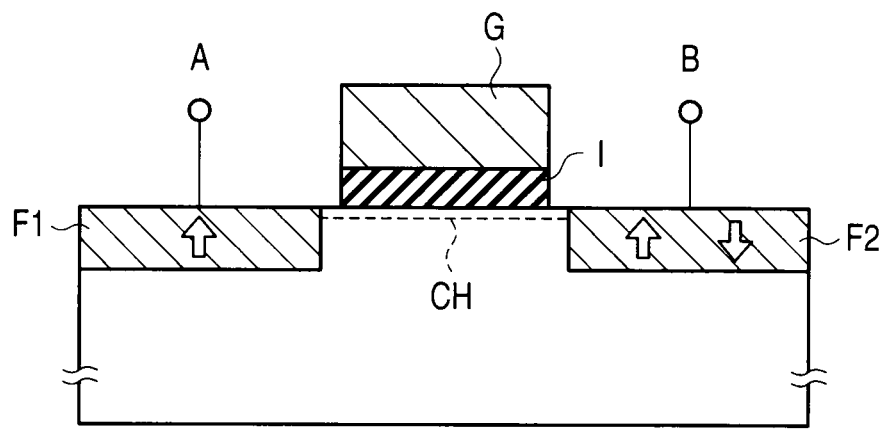
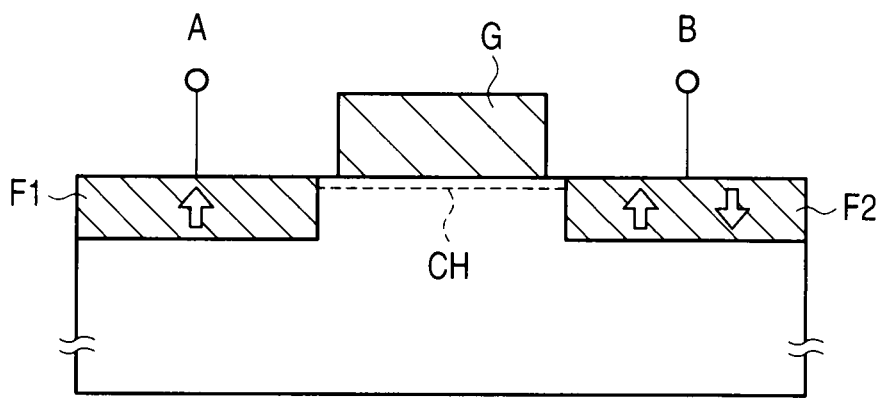
FIG. 5

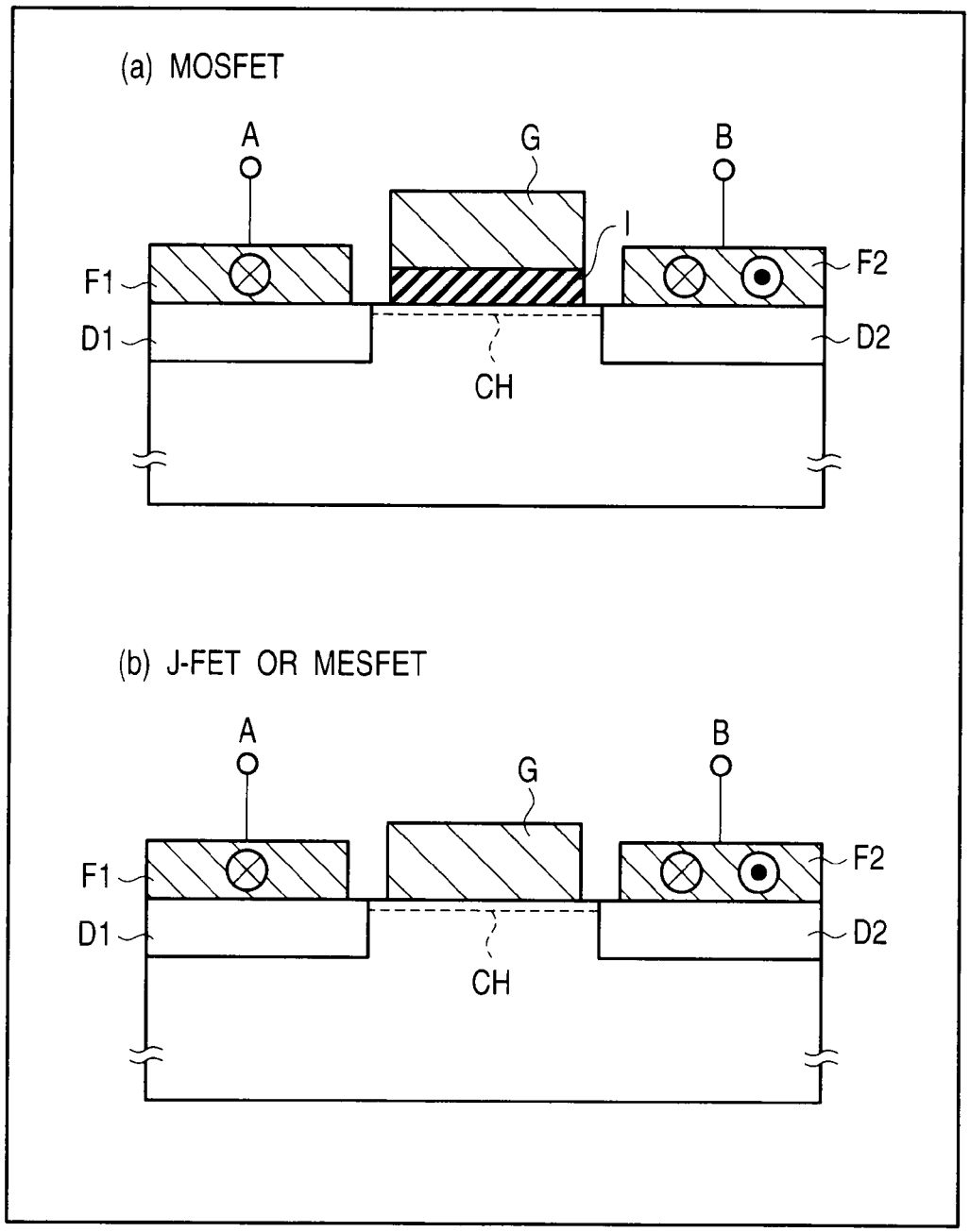
F I G. 6

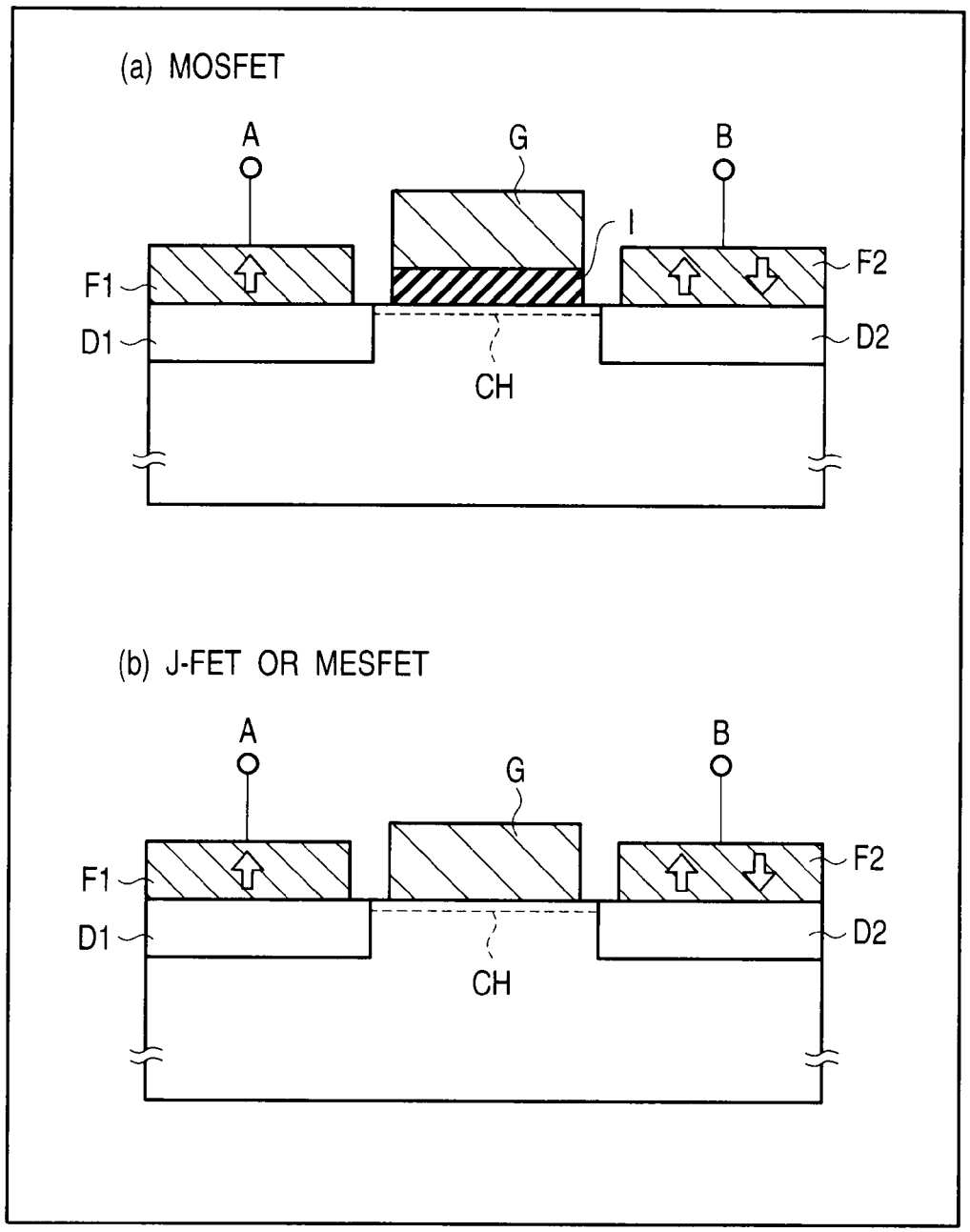
F I G. 7

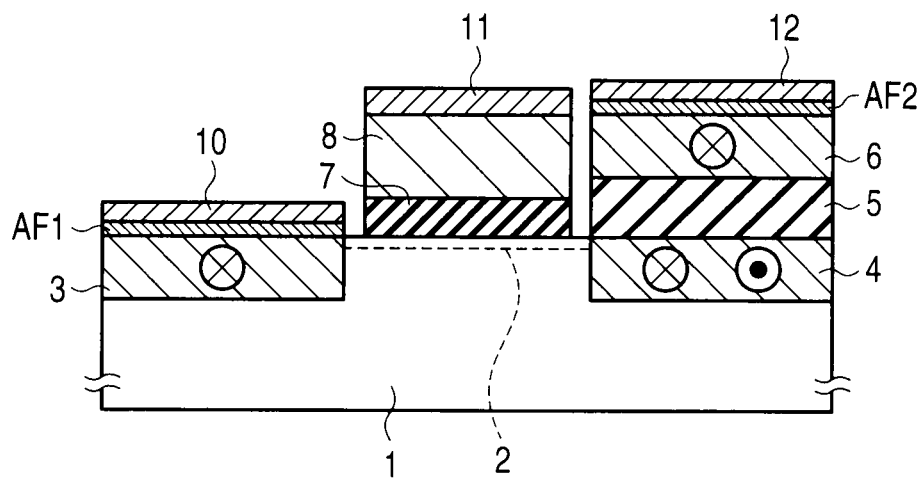
F I G. 10
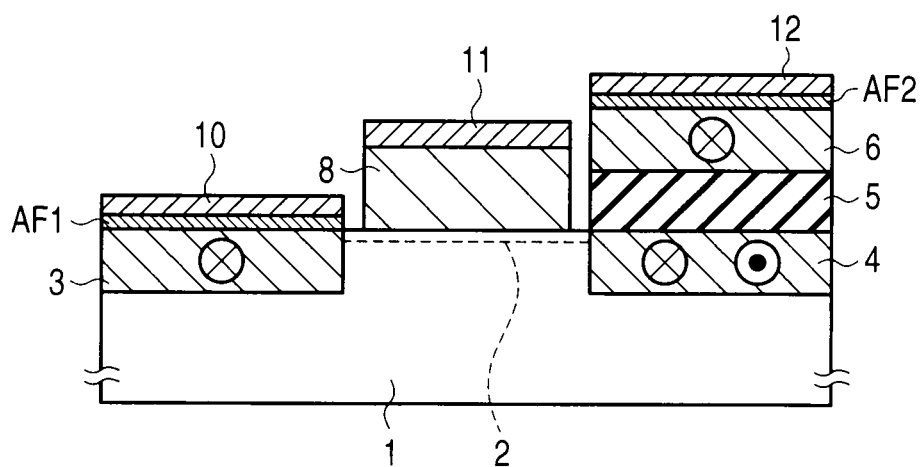
F I G. 11

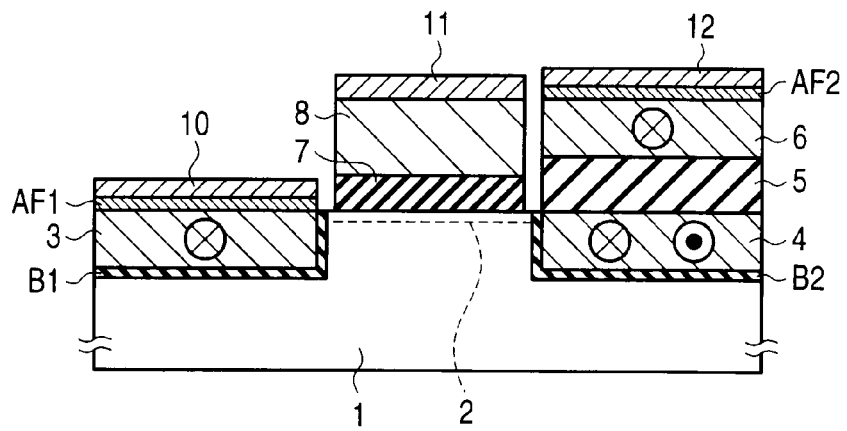
F I G. 1 2
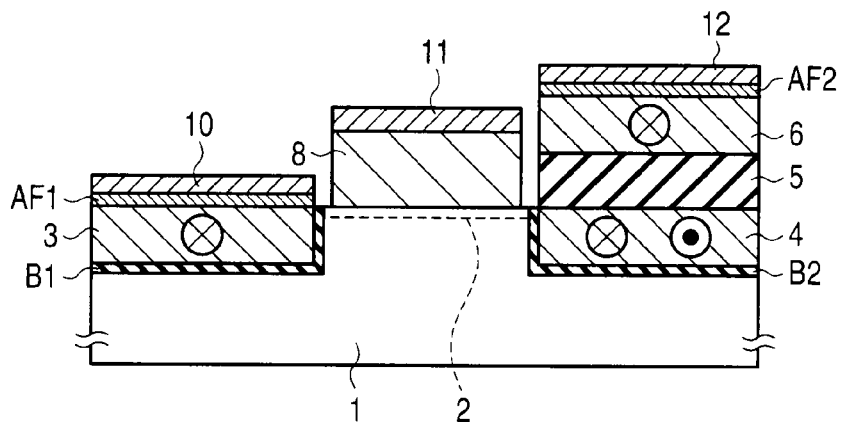
F I G. 1 3
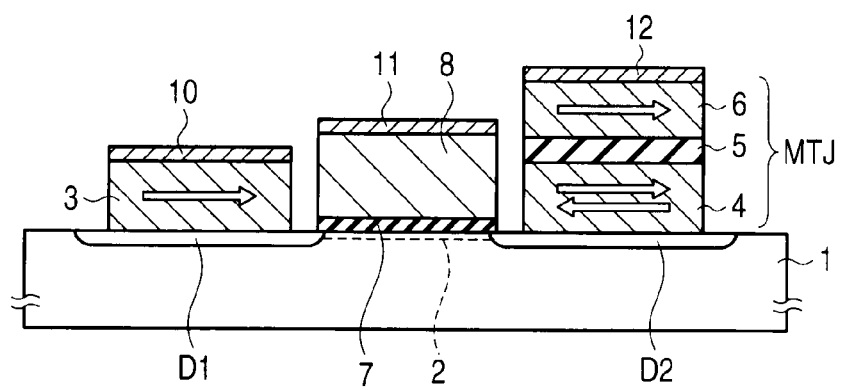
F I G. 1 4

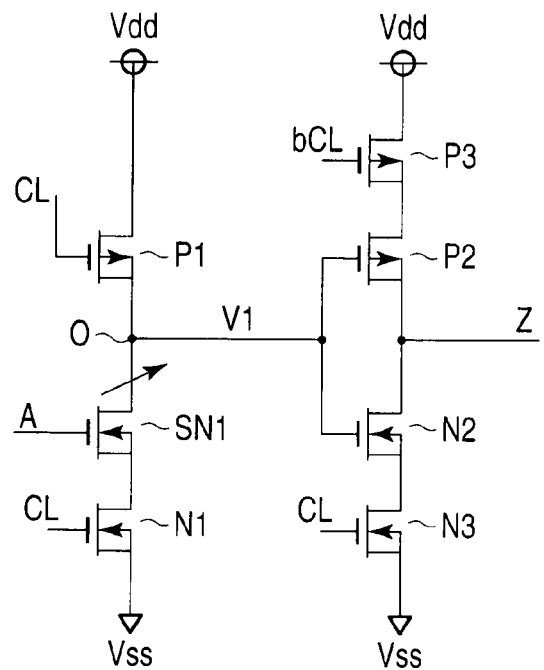
F I G. 1 8
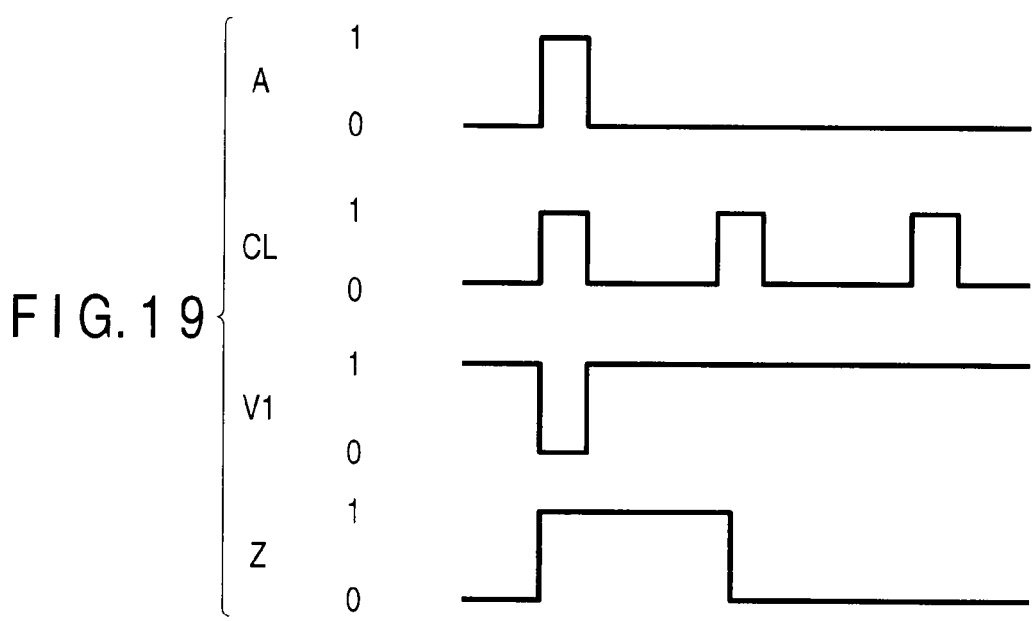
F I G. 1 9

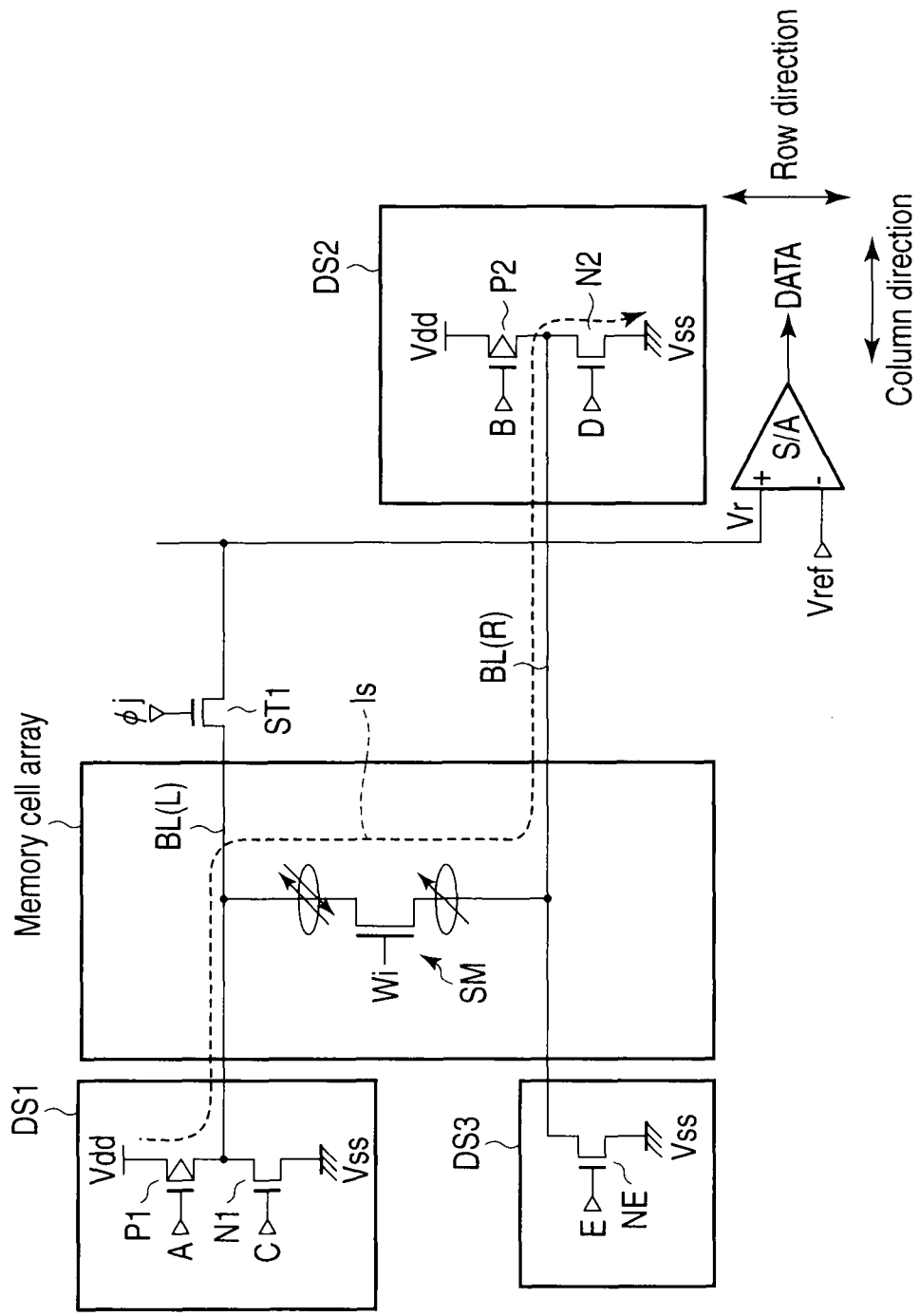
F I G. 21

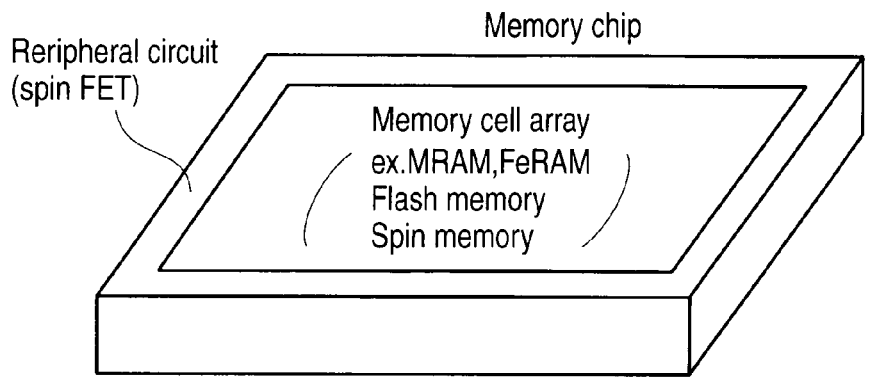
F I G. 2 2
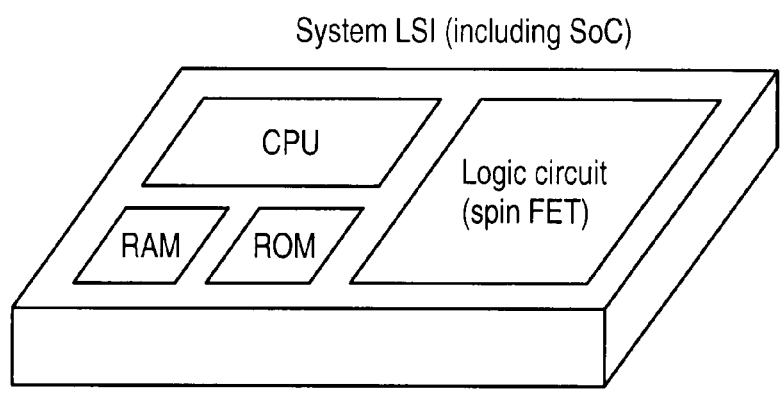
F I G. 2 3
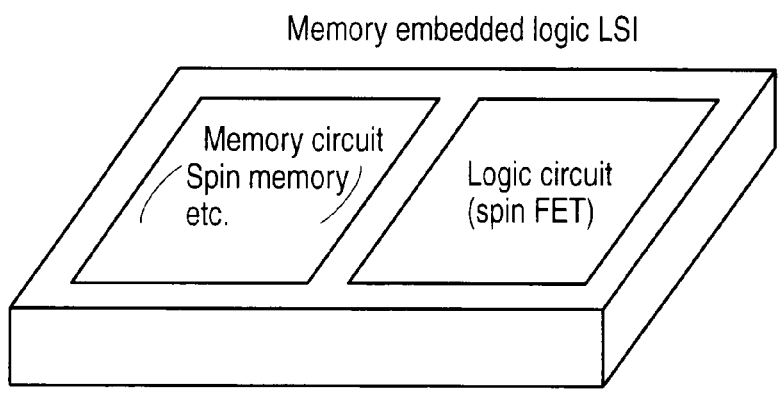
F I G. 2 4

SPIN TRANSISTOR, INTEGRATED CIRCUIT, AND MAGNETIC MEMORY

CROSS-REFERENCE TO RELATED APPLICATIONS

This application is based upon and claims the benefit of priority from prior Japanese Patent Application No. 2008-244760, filed Sep. 24, 2008, the entire contents of which are incorporated herein by reference.

BACKGROUND OF THE INVENTION

1. Field of the Invention

The present invention relates to a spin transistor, an integrated circuit, and a magnetic memory.

2. Description of the Related Art

Recently, new devices in which behaviors of a charge and a spin of an electron are simultaneously utilized, are being increasingly developed. Among others, in a spin transistor, ferromagnetic materials are used as a source electrode and a drain electrode, and an output characteristic is controlled by changing relative magnetization directions of the source electrode and drain electrode (for example, see S. Sugahara and M. Tanaka, Appl. Phys. Lett. 84 (2004) 2307, G. H. Fecher and C. Felser, J. Phys. D40, 1582 (2007), B. Balke et. al., Phys. Rev. B74 104405 (2006), and J. Phys.: Cond. Matt. 16, 3089 (2004)).

In the spin transistor, for example, a drain current (IDP) is increased when the relative magnetization directions of the source electrode and drain electrode are substantially parallel to each other, and a drain current (IDAP) is decreased when the relative magnetization directions are substantially anti-parallel to each other.

Preferably, an IDP/IDAP ratio, that is, a change in drain current between the parallelism and anti-parallelism of the relative magnetization direction is increased when the spin transistor is used in a magnetic memory or a reconfigurable logic circuit.

In order to increase the IDP/IDAP ratio, it is necessary to increase a spin polarization ratio of the magnetic materials used in the source electrode and drain electrode. However, even if the magnetic material having the spin polarization ratio of 100% can be used, unfortunately the IDP/IDAP ratio is deteriorated when a finite bias voltage is applied between the source electrode and drain electrodes.

BRIEF SUMMARY OF THE INVENTION

A spin transistor of an aspect of the present invention comprises a first ferromagnetic layer, a second ferromagnetic layer, a semiconductor layer between the first and second ferromagnetic layers, and a gate electrode on or above a surface of the semiconductor layer, the surface being between the first and second ferromagnetic layers. One of the first and second ferromagnetic layers has an invariable magnetization and the other has a variable magnetization. Data are stored by a relation of magnetization directions of the first and second ferromagnetic layers. Electrons flow from the first ferromagnetic layer to the second ferromagnetic layer in a read operation. And The first ferromagnetic layer comprises a ferromagnet which has a first minority spin band located at a high energy side and a second minority spin band located at a low energy side, and has a Fermi level in an area of the high energy side higher than a middle of a gap between the first and second minority spin bands.

A spin transistor of an aspect of the present invention comprises a first ferromagnetic layer, a second ferromagnetic layer, a semiconductor layer between the first and second ferromagnetic layers, and a gate electrode on or above a surface of the semiconductor layer, the surface being between the first and second ferromagnetic layers. One of the first and second ferromagnetic layers has an invariable magnetization and the other has a variable magnetization. Data are stored by a relation of magnetization directions of the first and second ferromagnetic layers. Electrons flow from the first ferromagnetic layer to the second ferromagnetic layer in a read operation. And the second ferromagnetic layer comprises a ferromagnet which has a first minority spin band located at a high energy side and a second minority spin band located at a low energy side, and has a Fermi level in an area of the low energy side lower than a middle of a gap between the first and second minority spin bands.

BRIEF DESCRIPTION OF THE SEVERAL VIEWS OF THE DRAWING

FIG. 4 is a diagram showing a spin transistor having a first basic structure;

FIG. 5 is a diagram showing a spin transistor having a second basic structure;

FIG. 6 is a diagram showing a spin transistor having a third basic structure;

FIG. 7 is a diagram showing a spin transistor having a fourth basic structure;

FIG. 10 is a diagram showing a spin transistor of a third embodiment;

FIG. 11 is a diagram showing a spin transistor of a fourth embodiment;

FIG. 12 is a diagram showing a spin transistor of a fifth embodiment;

FIG. 13 is a diagram showing a spin transistor of a sixth embodiment;

FIG. 14 is a diagram showing a spin transistor of a seventh embodiment;

FIG. 18 is a diagram showing an integrated circuit as an application example;

FIGS. 19 and 20 are waveform charts showing an operation of the integrated circuit of FIG. 18;

FIG. 21 is a diagram showing a magnetic memory as an application example;

FIG. 22 is a diagram showing a memory chip as an application example;

FIG. 23 is a diagram showing a system LSI as an application example; and

FIG. 24 is a diagram showing a memory embedded logic LSI as an application example.

DETAILED DESCRIPTION OF THE INVENTION

Figure 1:
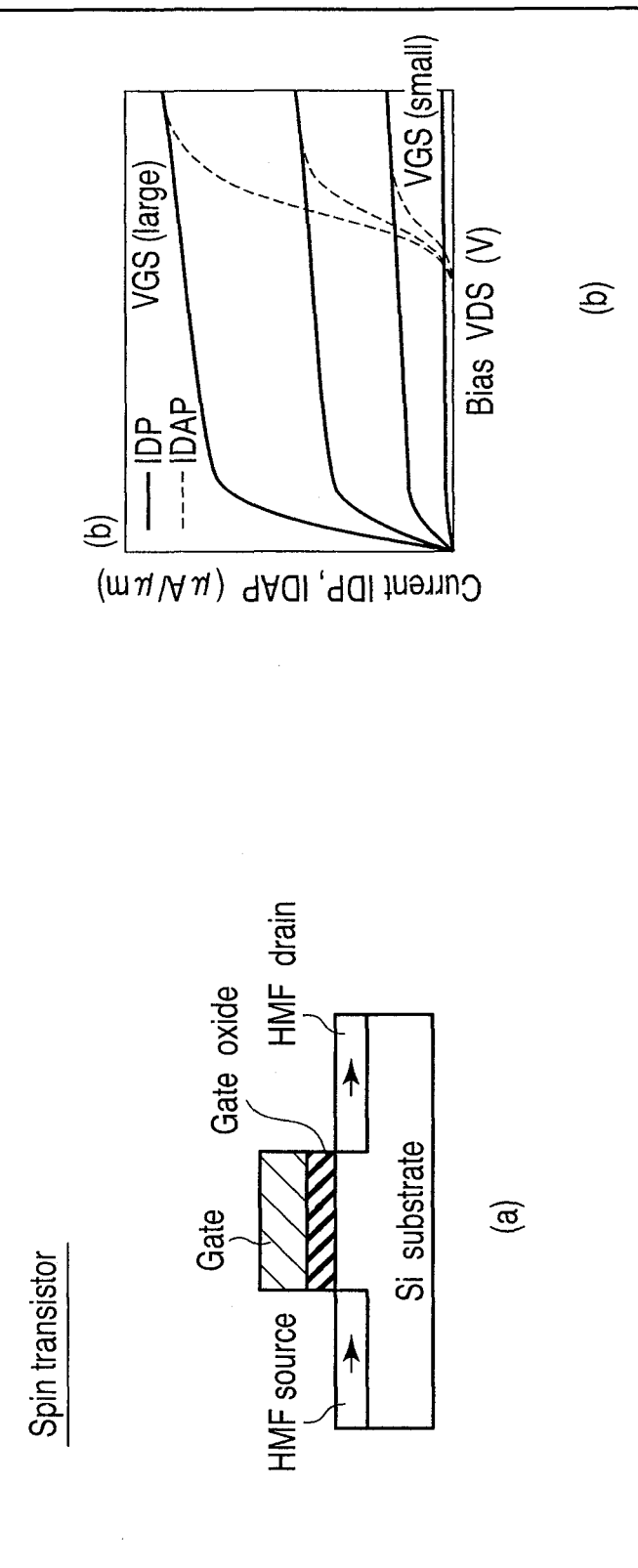
FIG. 1 is a diagram showing a dependence of a bias voltage on an IDP/IDAP ratio.

A spin transistor, an integrated circuit and a magnetic memory of an aspect of the present invention will be described in detail with reference to the accompanying drawing.

1. OUTLINE

In a spin transistor according to an exemplary embodiment of the invention in which both a source electrode and a drain electrode are formed by ferromagnetic layers, the ferromagnetic layer constituting the source electrode is made of a ferromagnetic material to prevent the deterioration of the IDP/IDAP ratio. The ferromagnetic material has two minority spin bands, one on a high energy side and another on a low energy side, and has a Fermi level on the high energy side of a center of a gap between the two minority spin bands.

Further, in the spin transistor of the exemplary embodiment in which both the source electrode and the drain electrode are formed by the ferromagnetic layers, the ferromagnetic layer constituting the drain electrode is made of a ferromagnetic material to prevent the deterioration of the IDP/IDAP ratio. The ferromagnetic material has two minority spin bands, one on a high energy side and another on the low energy side, and has a Fermi level on the low energy side of a center of a gap between the two minority spin bands.

At this point, a half metal is defined as a material that has two distributions of the independent minority spin bands, one on a high energy side and another on the low energy side. The ferromagnetic material constituting the source electrode can be made of the half metal.

In such cases, the gap between the minority spin bands shall mean a gap between the band on the high energy side and the band on the low energy side.

The ferromagnetic material may be made of a material other than a half metal, that is, a material in which the two distributions of the minority spin bands are provided, one on a high energy side and another on the low energy side while the two bands are continued. A Heusler alloy can be cited as an example of the material.

As used herein, the gap of the minority spin band shall mean a gap between a low-energy-side point at which a band state of density on the high energy side becomes 10% of the maximum value and a high-energy-side point at which the band state of density on the low energy side becomes 10% of the maximum value.

Specifically examples of the ferromagnetic material constituting the source electrode include $Co_2FeAl_{1-x}Si_x$ ($1>x>0.5$), $Co_2Mn_{1-x}Fe_xSi$ ($1>x>0.5$), and $Co_2Cr_{1-x}Fe_xAi$ ($1>x>0.4$). Examples of the ferromagnetic material constituting the drain electrode include $Co_2FeAl_{1-x}Si_x$ ($0<x<0.5$), $Co_2Mn_1Fe_xSi_x$ ($0<x<0.5$), and $Co_2Cr_{1-x}Fe_xAl$ ($0<x<0.4$).

The ferromagnetic material is expressed by a chemical composition $X_2YZ$ (where X is an element selected from a group comprising of Fe, Co, Ni, Cu, Zn, Ru, Rh, Pd, Ag, Cd, Ir, Pt, and Au, Y is an element selected from a group comprising of Ti, V, Cr, Mn, and Fe, and Z is an element selected from a group comprising of Ai, Ga, Si, Ge, and Sn), and a Fermi level position is adjusted in the ferromagnetic material such that at least one of a proportion of the selected element Y and a proportion of the selected element Z is set to a composition in which the number of electrons is increased or decreased compared with the composition in which the Fermi level is located in the center of the gap between the two minority spin bands.

For example, when the proportion of the element having the larger number of electrons (particularly, the larger number of valence electrons) is increased, the Fermi level can be shifted toward the high energy side. On the contrary, when the proportion of the element having the smaller number of electrons (particularly, the smaller number of valence electrons) is increased, the Fermi level can be shifted toward the low energy side.

2. PRINCIPLE

In the spin transistor of the exemplary embodiment, it is assumed that IDP is a drain current when the relative magnetization directions of the source and drain electrodes are substantially parallel to each other, and it is assumed that IDAP is a drain current when the relative magnetization directions of the source and drain electrodes are substantially anti-parallel to each other. The principle, in which the IDP/IDAP ratio is increased in applying a finite bias voltage between the source electrode and the drain electrode, will be described below.

That the relative magnetization directions of the source electrode and drain electrode are substantially parallel to each other shall mean that a relative angle $\theta$ between the magnetization direction of the source electrode and the magnetization direction of the drain electrode falls within a range of $0°$ (completely parallel)$\leq \theta < 90°$, and that the relative magnetization directions of the source electrode and drain electrode are substantially anti-parallel to each other shall mean that a relative angle $\theta$ between the magnetization direction of the source electrode and the magnetization direction of the drain electrode falls within a range of $90° < \theta \leq 180°$ (completely anti-parallel).

First, in a common spin transistor, it is necessary to ascertain the reason why the IDP/IDAP ratio is deteriorated in applying the finite bias voltage between the source electrode and the drain electrode.

FIG. 1 shows an experimental example of a relationship between a bias voltage VDS between the source electrode and the drain electrode of the spin transistor and drain currents IDP and IDAP. In the graph of FIG. 1, a voltage VGS between the gate and source is used as a parameter.

The detailed experimental example of FIG. 1 is disclosed in Non-Patent Document 1 (S. Sugahara and M. Tanaka, Appl. Phys. Lett. 84 (2004) 2307).

In FIG. 1A, a sample of the spin transistor is formed by ferromagnetic layers (HMF source/HMF drain) in which the source and the drain have in-plane magnetization, and a gate insulator has a thickness tox of 3 nm. FIG. 1A shows the state in which the magnetization directions of the two ferromagnetic layers are substantially parallel to each other, and the substantially anti-parallel state can be established by inverting one magnetization direction in the two ferromagnetic layers.

In FIG. 1B, in the experimental example, when the bias voltage DVS between the source electrode and the drain electrode is equal to or more than a predetermined value (for example, 0.3V), the IDP/IDAP ratio is rapidly deteriorated as the bias voltage VDS is increased. The IDP/IDAP ratio depends on the spin polarization ratio of the ferromagnetic layer, spin injection efficiency from the ferromagnetic layer into the channel, and spin relaxation in the channel in addition to the bias voltage between the source electrode and the drain electrode.

Figure 2:
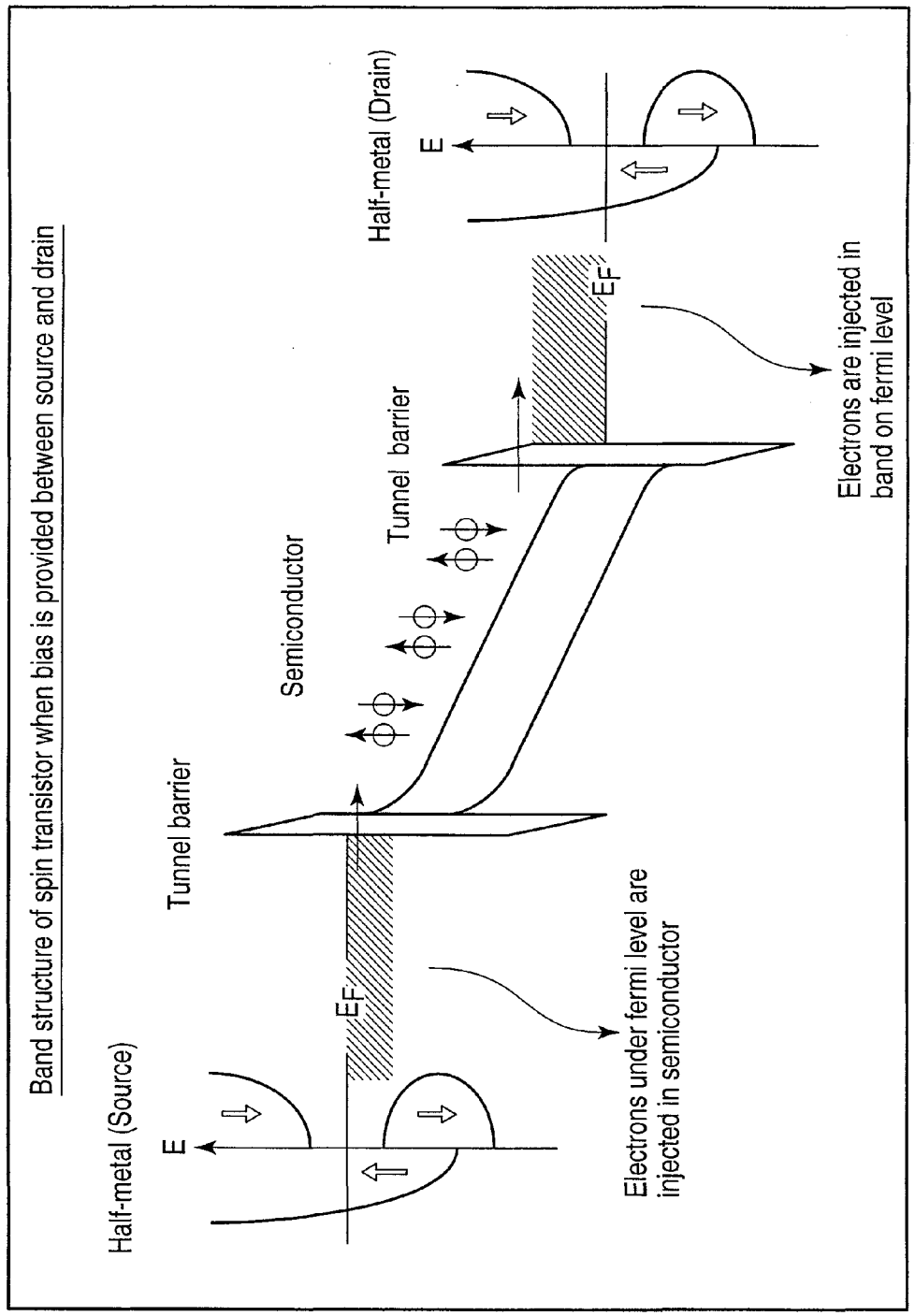
FIGS. 2 and 3 are band diagrams which show carriers relating to electric conduction.

FIG. 2 shows a band diagram when a bias voltage is applied between source and drain electrodes of a conventional spin transistor.

The carrier relating to the electric conduction of the spin transistor is considered in two categories, that is, electrons existing in the majority spin band (upward arrow in FIG. 2) and electrons existing in the minority spin band (downward arrow in FIG. 2).

Electrons injected into the semiconductor from the source electrode (for example, half metal) through a tunnel barrier have an energy that is lower than a Fermi surface (Fermi level) $E_F$. In the small bias voltage between the source electrode and the drain electrode, only the electrons existing in the majority spin band are injected from the source electrode into the semiconductor.

When the bias voltage between the source electrode and the drain electrode is increased, the electrons existing in the minority spin band are also injected into the semiconductor, and the spin polarization ratio of the electrons injected into the semiconductor is lowered, thereby deteriorating the IDP/IDAP ratio.

The electrons injected into the drain electrode (for example, half metal) from the semiconductor through the tunnel barrier have an energy that is higher than the Fermi surface $E_F$. The electrons are only injected into the majority spin band between the source electrode and the drain electrode, which has a small bias voltage.

When the bias voltage between the source electrode and the drain electrode is increased, the electrons are also injected into the minority spin band, and the selectivity between the majority spin and the minority spin is lowered in the drain electrode, thereby deteriorating the IDP/IDAP ratio.

Upon consideration of the electric conduction of the spin transistor in the electrons having the majority spins and the electrons having the minority spins, it is found that the deterioration of the IDP/IDAP ratio is attributed to the fact that the electrons having the minority spins act as electrical conductors.

Figure 3:
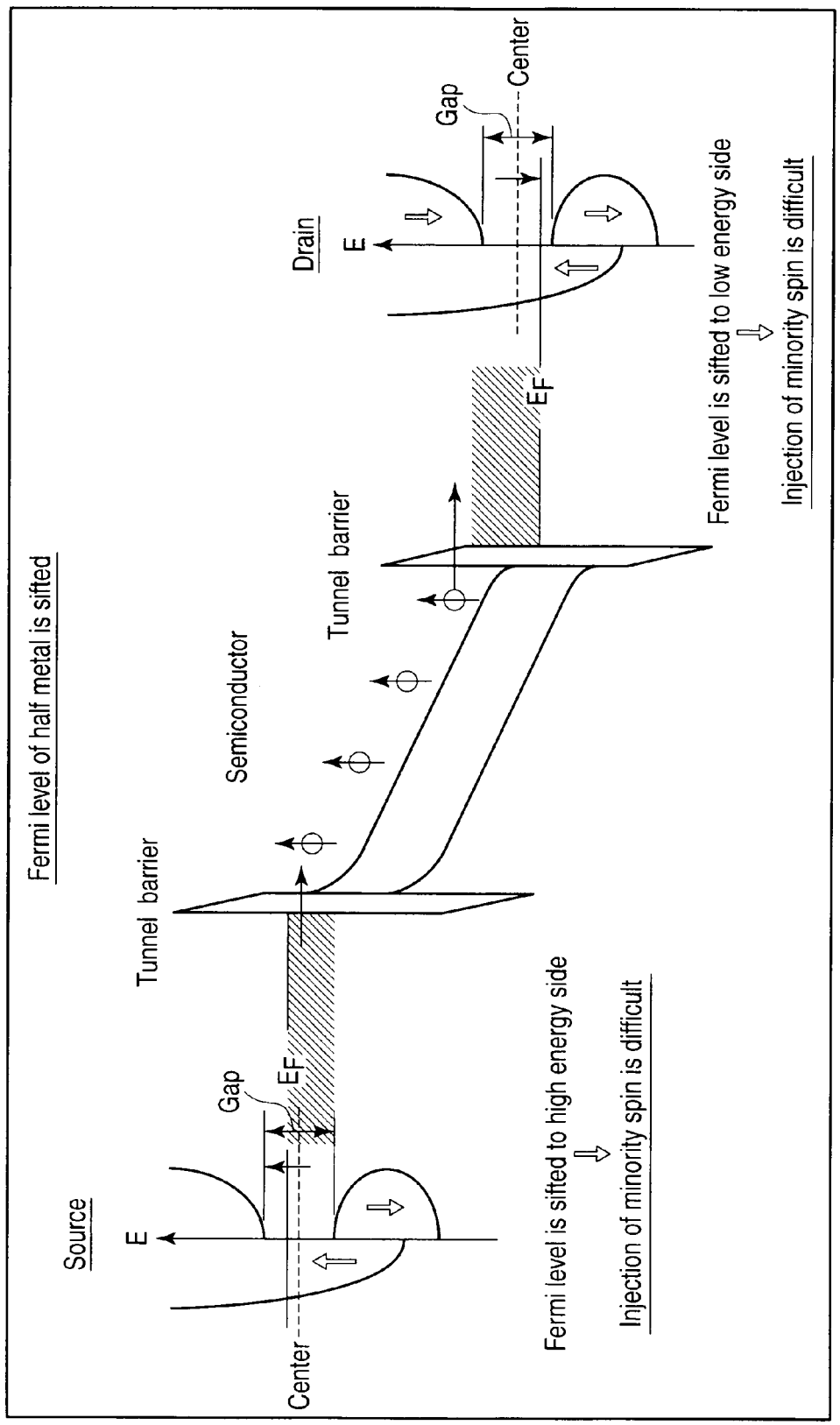

FIG. 3 shows a band diagram when a bias voltage is applied between source and drain electrodes of a spin transistor according to an embodiment of the invention.

Compared with the band diagram of FIG. 2, one of the features of the band diagram of FIG. 3 is that the Fermi level of the source electrode material is shifted toward the high energy side from the center of the gap between the two minority spin bands of the source electrode (for example, half metal).

When a finite bias voltage is applied between the source and drain electrodes, because virtually no electrons existing in the minority spin band are injected into semiconductor, the spin polarization ratio of electrons injected into the semiconductor is not lowered. Therefore, the IDP/IDAP ratio is improved.

Compared with the band diagram of FIG. 2, another feature of the band diagram of FIG. 3 is that the Fermi level of the drain electrode material is shifted toward the low energy side from the center of the gap between the two minority spin bands of the drain electrode (for example, half metal).

Therefore, when a finite bias voltage is applied between the source and drain electrodes, because virtually no electrons existing in the minority spin band are injected, selectivity of the majority spin and the minority spin is improved in the drain electrode. Therefore, the IDP/IDAP ratio is improved.

Thus, in the principle of the invention, the Fermi levels of the ferromagnetic materials constituting the source and drain electrodes of the spin transistor are shifted such that the electrons having the minority spins do not act as electrical conductors.

An example in which the Fermi levels of the ferromagnetic materials constituting the source and drain electrodes of the spin transistor are shifted will be described.

An example in which the Fermi level of the half metal is shifted will be described.

The case, in which $Co_2FeAl_{1-x}Si_X$ is used as the half metal, is as follows.

That is, the Fermi level of $Co_2FeAl_{1-x}Si_X$ can be shifted by controlling proportions x of Al and Si.

For $Co_2FeAl_{1-x}Si_X$, at x=0.5, a position of the Fermi level $E_F$ is located in the center of the gap between the minority spin bands.

When the proportion x of Si is increased (Si rich state), the number of electrons (particularly, the number of valence electrons) is increased in $Co_2FeAl_{1-x}Si_X$, and the Fermi level is shifted toward the high energy side from the center of the gap between the minority spin bands.

When the proportion x of Si is decreased (Si poor state), the number of electrons (particularly, the number of valence electrons) is decreased in $Co_2FeAl_{1-x}Si_X$, and the Fermi level is shifted toward the low energy side from the center of the gap between the minority spin bands.

Accordingly, the proportion x of Si is set more than 0.5 when $Co_2FeAl_{1-x}Si_X$ is used as the source electrode, and the proportion x of Si is set lower than 0.5 when $Co_2FeAl_{1-x}Si_X$ is used as the drain electrode.

A shift amount of the Fermi level is adjusted according to the required performance (IDP/IDAP ratio) of the spin transistor. For example, Non-Patent Document 2 (G. H. Fecher and C. Felser, J. Phys. D40, 1582 (2007)) discloses the shift of the Fermi level of $Co_2FeAl_{1-x}Si_X$.

The case in which $Co_2Mn_{1-x}Fe_xSi$ is used as the half metal is as follows.

That is, the Fermi level of $Co_2Mn_{1-x}Fe_xSi$ can be shifted by controlling proportions x of Fe and Mn.

For $Co_2Mn_{1-x}Fe_xSi$, at x=0.5, the position of the Fermi level $E_F$ is located in the center of the gap between the minority spin bands.

When the composition x of Fe is increased (Fe rich state) based on the composition x=0.5, the number of electrons (particularly, the number of valence electrons) is increased in $Co_2Mn_{1-x}Fe_xSi$ to shift the Fermi level toward the high energy side from the center of the gap between the minority spin bands.

When the composition x of Fe is decreased (Fe poor state), the number of electrons (particularly, the number of valence electrons) is decreased in $Co_2Mn_{1-x}Fe_xSi$ to shift the Fermi level toward the low energy side from the center of the gap between the minority spin bands.

Accordingly, the proportion x of Fe is set more than 0.5 when $Co_2Mn_{1-x}Fe_xSi$ is used as the source electrode, and the proportion x of Fe is set lower than 0.5 when $Co_2Mn_{1-x}Fe_xSi$ is used as the drain electrode.

The shift amount of the Fermi level is adjusted according to the required performance (IDP/IDAP ratio) of the spin transistor. For example, Non-Patent Document 3 (B. Balke et. al., Phys. Rev. B74 104405 (2006)) discloses the shift of the Fermi level of $Co_2Mn_{1-x}Fe_xSi$.

The Fermi level can be shifted in other materials by a similar principle.

For example, for $Co_2Cr_{1-x}Fe_xAl$, at x=0.4, the position of the Fermi level $E_F$ is located in the center of the gap between the minority spin bands. The proportion x is set more than 0.4 when $Co_2Cr_{1-x}Fe_xAl$ is used as the source electrode, and the proportion x is set lower than 0.4 when $Co_2Cr_{1-x}Fe_xAl$ is used as the drain electrode. A detailed description of this is disclosed in Non-Patent Document 4 (J. Phys.: Cond. Matt. 16, 3089 (2004)).

For the Heusler alloy expressed by the chemical composition $X_2YZ$ (where X is an element selected from a group comprising of Fe, Co, Ni, Cu, Zn, Ru, Rh, Pd, Ag, Cd, Ir, Pt, and Au, Y is an element selected from a group comprising of Ti, V, Cr, Mn, and Fe, and Z is an element selected from a group comprising of Al, Ga, Si, Ge, and Sn), the position of the Fermi level $E_F$ is located in the center of the gap between the minority spin bands.

Accordingly, the Fermi level is shifted toward the high energy side from the center of the gap between the minority spin bands, when the elements constituting the chemical composition $X_2YZ$ are partially replaced with the element having a higher number of electrons (particularly, the number of valence electrons) than that of the replaced electron.

The Fermi level is shifted toward the low energy side from the center of the gap between the minority spin bands, when the elements constituting the chemical composition $X_2YZ$ are partially replaced with the element having a lower number of electrons (particularly, the number of valence electrons) than that of the replaced electron.

3. BASIC STRUCTURE

(1) First Basic Structure

FIG. 4 shows a first basic structure.

A first ferromagnetic layer F1 is made of an in-plane magnetic material whose magnetization direction is invariable, and a second ferromagnetic layer F2 is made of an in-plane magnetic material whose magnetization direction is variable.

As used herein, that the magnetization direction is invariable shall mean that the magnetization direction is not changed before and after the write with the write current, and that the magnetization direction is variable shall mean that the magnetization direction is changed before and after the write with the write current.

A gate electrode G is disposed on a channel (semiconductor layer) CH between the first ferromagnetic layer F1 and the second ferromagnetic layer F2. The spin transistor comprises a MOSFET (FIG. 4A) when a gate insulator I is disposed between the channel CH and the gate electrode G, and the spin transistor comprises a Junction (J)-FET or MES (metal-semiconductor) FET (FIG. 4B) when the gate electrode G is directly disposed on the channel CH.

The magnetization directions of the first and second ferromagnetic layers F1 and F2 become parallel or anti-parallel by changing the magnetization direction of the second ferromagnetic layer F2. That is, data is stored according to the magnetization direction of the second ferromagnetic layer F2.

Writing is performed by passing a write current between terminals A and B according to the write data. Reading is performed by passing a read current from the terminal B to the terminal A. At this point, the electrons flow from the terminal A (first ferromagnetic layer F1) toward the terminal B (second ferromagnetic layer F2).

Therefore, at least one of the first and second ferromagnetic layers F1 and F2 is made of the ferromagnetic material satisfying the following requirement.

That is, for the first ferromagnetic layer F1, the two minority spin bands are provided on the high energy side and the low energy side, and the Fermi level is located on the high energy side of the center of the gap between the two minority spin bands.

For the second ferromagnetic layer F2, the two minority spin bands are provided on the high energy side and the low energy side, and the Fermi level is located on the low energy side of the center of the gap between the two minority spin bands.

(2) Second Basic Structure

FIG. 5 shows a second basic structure.

The first ferromagnetic layer F1 is made of a perpendicular magnetic material whose magnetization direction is invariable, and the second ferromagnetic layer F2 is made of a perpendicular magnetic material whose magnetization direction is variable. The first and second ferromagnetic layers F1 and F2 are formed into the perpendicular magnetic film having magnetization in a direction perpendicular to a film surface thereof by the following technique.

For example, when the ferromagnetic material has the in-plane magnetization, the magnetization direction of the ferromagnetic material can be orientated from the in-plane direction toward the perpendicular direction by depositing the magnetic material having the magnetization perpendicular to the film surface thereof.

An ordered alloy having a crystal structure of an L10 structure and including at least one of elements of iron (Fe), cobalt (Co), nickel (Ni), and manganese (Mn) and at least one of elements of platinum (Pt), palladium (Pd), rhodium (Rh), and aluminum (Al) can be cited as an example of the magnetic material having the magnetization perpendicular to the film surface. Examples of the ordered alloys include FePd, FePt, and CoPt.

The gate electrode G is disposed on the channel (semiconductor layer) CH between the first ferromagnetic layer F1 and the second ferromagnetic layer F2. The spin transistor comprises a MOSFET (FIG. 5A) when the gate insulator I is disposed between the channel CH and the gate electrode G, and the spin transistor comprises a Junction (J)-FET or MESFET (FIG. 5B) when the gate electrode G is directly disposed on the channel CH.

The magnetization directions of the first and second ferromagnetic layers F1 and F2 become parallel or anti-parallel by changing the magnetization direction of the second ferromagnetic layer F2. That is, data is stored according to the magnetization direction of the second ferromagnetic layer F2.

Writing is performed by passing the write current between terminals A and B according to the write data. Reading is performed by passing the read current from the terminal B to the terminal A. At this point, the electrons flow from the terminal A (first ferromagnetic layer F1) toward the terminal B (second ferromagnetic layer F2).

Therefore, at least one of the first and second ferromagnetic layers F1 and F2 is made of the ferromagnetic material satisfying the following requirement.

For the first ferromagnetic layer F1, the two minority spin bands are provided on the high energy side and the low energy side, and the Fermi level is located on the high energy side of the center of the gap between the two minority spin bands.

For the second ferromagnetic layer F2, the two minority spin bands are provided on the high energy side and the low energy side, and the Fermi level is located on the low energy side of the center of the gap between the two minority spin bands.

(3) Third Basic Structure

FIG. 6 shows a third basic structure.

The gate electrode G is disposed on a channel (semiconductor layer) CH between first and second diffusion layers D1 and D2. The spin transistor comprises a MOSFET (FIG. 6A) when a gate insulator I is disposed between the channel CH and the gate electrode G, and the spin transistor comprises a Junction (J)-FET or MES (metal-semiconductor) FET (FIG. 6B) when the gate electrode G is directly disposed on the channel CH.

The first ferromagnetic layer F1 is disposed on the first diffusion layer D1, and the second ferromagnetic layer F2 is disposed on the second diffusion layer D2.

As to the positional relationship between the channel CH and the first and second ferromagnetic layers F1 and F2, in the third basic structure, it is assumed that the channel CH exists between the first and second ferromagnetic layers F1 and F2.

The first ferromagnetic layer F1 is made of the in-plane magnetic material whose magnetization direction is invariable, and the second ferromagnetic layer F2 is made of an in-plane magnetic material whose magnetization direction is variable. The magnetization directions of the first and second ferromagnetic layers F1 and F2 become parallel or anti-parallel by changing the magnetization direction of the second ferromagnetic layer F2. That is, data is stored according to the magnetization direction of the second ferromagnetic layer F2.

Writing is performed by passing the write current between terminals A and B according to the write data. Reading is performed by passing the read current from the terminal B to the terminal A. At this point, the electrons flow from the terminal A (first ferromagnetic layer F1) toward the terminal B (second ferromagnetic layer F2).

Therefore, at least one of the first and second ferromagnetic layers F1 and F2 is made of the ferromagnetic material satisfying the following requirement.

For the first ferromagnetic layer F1, the two minority spin bands are provided on the high energy side and the low energy side, and the Fermi level is located on the high energy side of the center of the gap between the two minority spin bands.

For the second ferromagnetic layer F2, the two minority spin bands are provided on the high energy side and the low energy side, and the Fermi level is located on the low energy side of the center of the gap between the two minority spin bands.

(4) Fourth Basic Structure

FIG. 7 shows a fourth basic structure.

The gate electrode G is disposed on the channel (semiconductor layer) CH between the first and second diffusion layers D1 and D2. The spin transistor comprises a MOSFET (FIG. 7A) when a gate insulator I is disposed between the channel CH and the gate electrode G, and the spin transistor comprises a Junction (J)-FET or MESFET (FIG. 7B) when the gate electrode G is directly disposed on the channel CH.

The first ferromagnetic layer F1 is disposed on the first diffusion layer D1, and the second ferromagnetic layer F2 is disposed on the second diffusion layer D2.

As to the positional relationship between the channel CH and the first and second ferromagnetic layers F1 and F2, in the fourth basic structure, it is assumed that the channel CH exists between the first and second ferromagnetic layers F1 and F2.

The first ferromagnetic layer F1 is made of the perpendicular magnetic material whose magnetization direction is invariable, and the second ferromagnetic layer F2 is made of the perpendicular magnetic material whose magnetization direction is variable. At this point, the first and second ferromagnetic layers F1 and F2 can be formed into the perpendicular magnetic film having the magnetization perpendicular to the film surface thereof by the technique similar to that of the second basic structure.

The magnetization directions of the first and second ferromagnetic layers F1 and F2 become parallel or anti-parallel by changing the magnetization direction of the second ferromagnetic layer F2. That is, data is stored according to the magnetization direction of the second ferromagnetic layer F2.

Writing is performed by passing the write current between terminals A and B according to the write data. Reading is performed by passing the read current from the terminal B to the terminal A. At this point, the electrons flow from the terminal A (first ferromagnetic layer F1) toward the terminal B (second ferromagnetic layer F2).

Therefore, at least one of the first and second ferromagnetic layers F1 and F2 is made of the ferromagnetic material satisfying the following requirement.

For the first ferromagnetic layer F1, the two minority spin bands are provided on the high energy side and the low energy side, and the Fermi level is located on the high energy side of the center of the gap between the two minority spin bands.

For the second ferromagnetic layer F2, the two minority spin bands are provided on the high energy side and the low energy side, and the Fermi level is located on the low energy side of the center of the gap between the two minority spin bands.

(5) Other

The first to fourth basic structures define the minimum requirement for the invention, and a high-performance spin transistor can be formed by an additional constituent as illustrated in the following embodiments.

In the third and fourth basic structures (FIGS. 6 and 7), the first and second diffusion layers D1 and D2 may be omitted.

4. EMBODIMENTS

(1) First Embodiment

Figure 8:
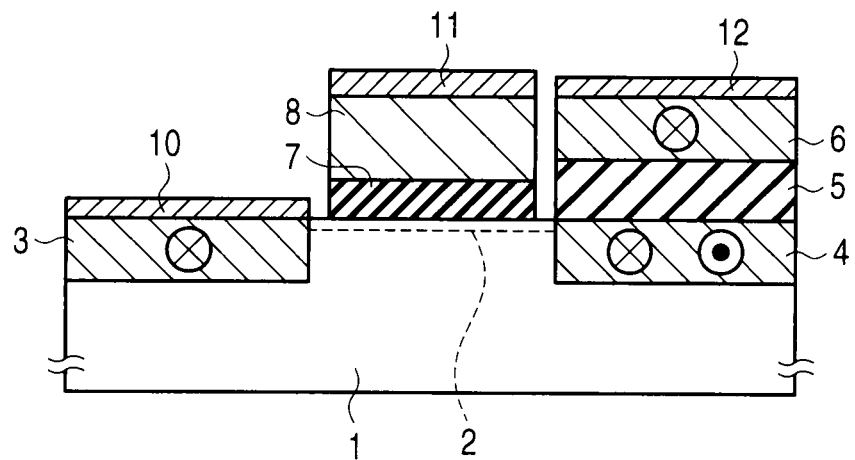
FIG. 8 is a diagram showing a spin transistor of a first embodiment.

FIG. 8 is a spin transistor according to a first embodiment of the invention.

The spin transistor of the first embodiment has the MOSFET structure.

Two recesses are made in a surface of a semiconductor substrate 1, one of the recesses is filled with a ferromagnetic layer 3, and another recess is filled with a ferromagnetic layer 4. A gate electrode 8 is formed on a channel 2 between the ferromagnetic layers 3 and 4 while a gate insulator 7 is interposed between the gate electrode 8 and the channel 2.

The ferromagnetic layer 3 is a magnetic pinned layer whose magnetization direction is invariable, and the ferromagnetic layer 4 is a magnetic free layer whose magnetization direction is variable. A ferromagnetic layer 6 is formed on the ferromagnetic layer 4 with a non-magnetic layer 5 interposed therebetween. The non-magnetic layer 5 may be either an insulating material or a conductive material. The ferromagnetic layer 6 is the magnetic pinned layer whose magnetization direction is invariable.

Electrodes 10, 11, and 12 are formed on the ferromagnetic layers 3 and 6 and the gate electrode 8, and the electrodes 10, 11, and 12 have functions of protecting the ferromagnetic layers 3 and 6 and the gate electrode 8.

In the spin transistor of the first embodiment, the current flowing between the electrodes 10 and 12 depends on a bias voltage applied between the electrodes 10 and 12, and the relative magnetization directions of the ferromagnetic layers 3 and 4.

For example, the large current (IDP) flows when the relative magnetization directions of the ferromagnetic layers 3 and 4 are substantially parallel in applying a gate voltage to the electrode 11, and the small current (IDAP) flows when the relative magnetization directions of the ferromagnetic layers 3 and 4 are substantially anti-parallel in applying the gate voltage to the electrode 11. Depending on the materials for the semiconductor substrate 1 and ferromagnetic layers 3 and 4, sometimes the large current (IDP) flows when the relative magnetization directions of the ferromagnetic layers 3 and 4 are substantially anti-parallel in applying the gate voltage to the electrode 11, and the small current (IDAP) flows when the relative magnetization directions of the ferromagnetic layers 3 and 4 are substantially parallel in applying the gate voltage to the electrode 11.

There are two resistance states of the spin transistor. That is, in one of the resistance states, the spin transistor is in a high-resistance state when two magnetic materials constituting a magnetic tunnel junction or semiconductor-magnetic material junction are anti-parallel, and the spin transistor is in a low-resistance state when the two magnetic materials are parallel. In the other resistance state, the spin transistor is in the high-resistance state when the two magnetic materials are parallel, and the spin transistor is in the low-resistance state when the two magnetic materials are anti-parallel. A junction structure made of FeCo/Si/FeCo can be cited as a specific example of the latter. For example, the junction structure made of FeCo/Si/FeCo is described in "Spin transport in a lateral spin-injection device with an FM/Si/FM junction", W. J. Hwang et al., Journal of Magnetism and Magnetic Materials 272-276 (2004) 1915-19161.

In the first to fourth basic structures, the spin transistor is in the high-resistance state when the two magnetic materials are anti-parallel, and the spin transistor is in the low-resistance state when the two magnetic materials are parallel. However, the first to fourth basic structures can also be applied to the spin transistor that is in the high-resistance state when the two magnetic materials are parallel while being in the low-resistance state, when the two magnetic materials are anti-parallel.

The same holds true for the following second to ninth embodiments.

In the first embodiment, any one of the ferromagnetic layers 3 and 4 may comprise the source side, while the other comprises the drain side.

However, in the ferromagnetic layers 3 and 4, it is necessary to satisfy the following requirement in at least one of the ferromagnetic layers that comprise either the source side or the drain side.

The ferromagnetic layer constituting the source side is made of the ferromagnetic material in which the two minority spin bands are provided on the high energy side and the low energy side and the Fermi level is located on the high energy side of the center of the gap between the two minority spin bands.

The ferromagnetic layer constituting the drain side is made of the ferromagnetic material in which the two minority spin bands are provided on the high energy side and the low energy side and the Fermi level is located on the low energy side of the center of the gap between the two minority spin bands.

Therefore, the IDP/IDAP ratio can be improved while the bias voltage is applied between the electrodes 10 and 12.

When at least one tunnel barrier layer is formed between the semiconductor substrate 1 and the ferromagnetic material 3 or between the semiconductor substrate 1 and the ferromagnetic material 4, the spin injection efficiency can be enhanced to further improve the performance of the spin transistor.

In the first embodiment, the ferromagnetic layers 3, 4, and 6 have the in-plane magnetization. Alternatively, the ferromagnetic layers 3, 4, and 6 may have the perpendicular magnetization.

A method for producing the spin transistor of FIG. 8 will briefly be described.

The channel 2 is formed on the semiconductor substrate 1 by ion implantation and annealing, and the gate insulator 7 and the gate electrode 8 are formed.

The recesses are made in the semiconductor substrate 1 by etching.

The recesses are embedded by the ferromagnetic materials to form the ferromagnetic layers 3 and 4. Then the non-magnetic layer 5 and ferromagnetic layer 6 are formed on the ferromagnetic layer 4.

The electrodes 10, 11, and 12 are formed on the ferromagnetic layers 3 and 6 and the gate electrode 8.

Finally, annealing is performed at 270° C. for one hour in an even magnetic field of 1 T in order to impart magnetic anisotropy to the ferromagnetic layers 3, 4, and 6.

Thus, the spin transistor of FIG. 8 is formed.

(2) Second Embodiment

Figure 9:
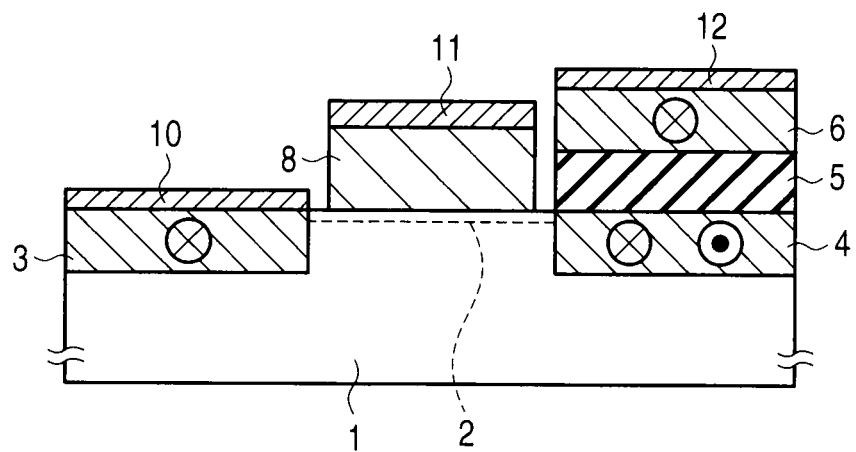
FIG. 9 is a diagram showing a spin transistor of a second embodiment.

FIG. 9 is a spin transistor according to a second embodiment of the invention.

The spin transistor of the second embodiment has the J-FET structure or MESFET structure.

In the J-FET structure, the gate electrode 8 is made of a semiconductor, and the conduction type of the gate electrode 8 is opposite to the conduction type of the semiconductor substrate 1. In the MESFET structure, the gate electrode 8 is made of metal. In the MESFET structure, the semiconductor substrate 1 is mainly made of a compound semiconductor (such as GaAs, InP, and SiC), and a Schottky junction is formed by the semiconductor substrate 1 and the gate electrode 8.

Two recesses are made in the surface of the semiconductor substrate 1, one of the recesses is filled with the ferromagnetic layer 3, and the other recess is filled with the ferromagnetic layer 4. The gate electrode 8 is formed on the channel 2 between the ferromagnetic layers 3 and 4.

The ferromagnetic layer 3 is the magnetic pinned layer whose magnetization direction is invariable, and the ferromagnetic layer 4 is the magnetic free layer whose magnetization direction is variable. The ferromagnetic layer 6 is formed on the ferromagnetic layer 4 with the non-magnetic layer 5 interposed therebetween. The non-magnetic layer 5 may be either an insulating material or a conductive material. The ferromagnetic layer 6 is the magnetic pinned layer whose magnetization direction is invariable.

The electrodes 10, 11, and 12 are formed on the ferromagnetic layers 3 and 6 and the gate electrode 8, and the electrodes 10, 11, and 12 have functions of protecting the ferromagnetic layers 3 and 6 and the gate electrode 8.

In the spin transistor of the second embodiment, as with the first embodiment, the current flowing between the electrodes 10 and 12 depends on the bias voltage applied between the electrodes 10 and 12 and the relative magnetization directions of the ferromagnetic layers 3 and 4.

In the second embodiment, any one of the ferromagnetic layers 3 and 4 may comprise the source side, while the other comprises the drain side.

However, in the ferromagnetic layers 3 and 4, it is necessary to satisfy the following requirement in at least one of the ferromagnetic layers that comprise either the source side or the drain side.

The ferromagnetic layer constituting the source side is made of the ferromagnetic material in which the two minority spin bands are provided on the high energy side and the low energy side and the Fermi level is located on the high energy side of the center of the gap between the two minority spin bands.

The ferromagnetic layer constituting the drain side is made of the ferromagnetic material in which the two minority spin bands are provided on the high energy side and the low energy side and the Fermi level is located on the low energy side of the center of the gap between the two minority spin bands.

Therefore, the IDP/IDAP ratio can be improved while the bias voltage is applied between the electrodes 10 and 12.

When at least one tunnel barrier layer is formed between the semiconductor substrate 1 and the ferromagnetic material 3 or between the semiconductor substrate 1 and the ferromagnetic material 4, the spin injection efficiency can be enhanced to further improve the performance of the spin transistor.

In the second embodiment, the ferromagnetic layers 3, 4, and 6 have the in-plane magnetization. Alternatively, the ferromagnetic layers 3, 4, and 6 may have the perpendicular magnetization.

A method for producing the spin transistor of FIG. 9 will briefly be described.

The channel 2 is formed on the semiconductor substrate 1 by ion implantation and annealing, and the gate electrode 8 is formed.

The recesses are made in the semiconductor substrate 1 by etching.

The recesses are embedded by the ferromagnetic materials to form the ferromagnetic layers 3 and 4. Then the non-magnetic layer 5 and ferromagnetic layer 6 are formed on the ferromagnetic layer 4.

The electrodes 10, 11, and 12 are formed on the ferromagnetic layers 3 and 6 and the gate electrode 8.

Finally, annealing is performed at 270° C. for one hour in an even magnetic field of 1 T in order to impart magnetic anisotropy to the ferromagnetic layers 3, 4, and 6.

Thus, the spin transistor of FIG. 9 can be formed.

(3) Third Embodiment

FIG. 10 is a spin transistor according to a third embodiment of the invention.

The spin transistor of the third embodiment has the MOSFET structure. The spin transistor of the third embodiment is a modification of the spin transistor of the first embodiment.

The spin transistor of the third embodiment differs from the spin transistor of the first embodiment in that an anti-ferromagnetic layer AF1 is disposed between the ferromagnetic layer 3 and electrode 10 while an anti-ferromagnetic layer AF2 is disposed between the ferromagnetic layer 6 and the electrode 12. The anti-ferromagnetic layers AF1 and AF2 are also called a pinned layer, and the anti-ferromagnetic layers AF1 and AF2 have functions of pinning the magnetization of the ferromagnetic layers 3 and 6 that are of the magnetic pinned layers.

Due to the existence of the anti-ferromagnetic layers AF1 and AF2, the magnetization directions of the ferromagnetic layers 3 and 6 are stabilized to suppress the variation in IDP/IDAP ratio, so that stable operation of the spin transistor can be realized.

When the ferromagnetic layers 3, 4, and 6 have the perpendicular magnetization, sometimes the magnetization directions of the ferromagnetic layers 3 and 6 are stabilized irrespective of the existence of the anti-ferromagnetic layer.

(4) Fourth Embodiment

FIG. 11 is a spin transistor according to a fourth embodiment of the invention.

The spin transistor of the fourth embodiment has the J-FET structure or MESFET structure. The spin transistor of the fourth embodiment is a modification of the spin transistor of the second embodiment.

The spin transistor of the fourth embodiment differs from the spin transistor of the second embodiment in that the anti-ferromagnetic layer AF1 is disposed between the ferromagnetic layer 3 and electrode 10 while the anti-ferromagnetic layer AF2 is disposed between the ferromagnetic layer 6 and the electrode 12. The anti-ferromagnetic layers AF1 and AF2 are also called a pinned layer, and the anti-ferromagnetic layers AF1 and AF2 have functions of pinning the magnetization of the ferromagnetic layers 3 and 6 that are of the magnetic pinned layers.

Due to the existence of the anti-ferromagnetic layers AF1 and AF2, the magnetization directions of the ferromagnetic layers 3 and 6 are stabilized to suppress the variation in IDP/IDAP ratio, so that stable operation of the spin transistor can be realized.

When the ferromagnetic layers 3, 4, and 6 have the perpendicular magnetization, sometimes the magnetization directions of the ferromagnetic layers 3 and 6 are stabilized irrespective of the existence of the anti-ferromagnetic layer.

(5) Fifth Embodiment

FIG. 12 is a spin transistor according to a fifth embodiment of the invention.

The spin transistor of the fifth embodiment has the MOSFET structure. The spin transistor of the fifth embodiment is a modification of the spin transistor of the third embodiment.

The spin transistor of the fifth embodiment differs from the spin transistor of the third embodiment in that a tunnel barrier layer B1 is disposed between the semiconductor substrate 1 and the ferromagnetic layer 3 while a tunnel barrier layer B2 is disposed between the semiconductor substrate 1 and the ferromagnetic layer 4. The tunnel barrier layers B1 and B2 have functions of injecting the carriers having the high spin polarization ratios into the channel 2 to enlarge a change in conductance associated with the changes in magnetization directions of the ferromagnetic layers 3 and 4.

The tunnel barrier layers B1 and B2 also have barrier functions of preventing reaction between the semiconductor substrate 1 and the ferromagnetic layers 3 and 4. Therefore, a good junction surface between the semiconductor substrate 1 and the ferromagnetic layers 3 and 4 can be formed to achieve improvement of a production yield.

One of the tunnel barrier layers B1 and B2 may be omitted. Although the spin transistor of the fifth embodiment includes the anti-ferromagnetic layers AF1 and AF2, the anti-ferromagnetic layers AF1 and AF2 may not be used.

(6) Sixth Embodiment

FIG. 13 is a spin transistor according to a sixth embodiment of the invention.

The spin transistor of the sixth embodiment has the J-FET structure or MESFET structure. The spin transistor of the sixth embodiment is a modification of the spin transistor of the fourth embodiment.

The spin transistor of the sixth embodiment differs from the spin transistor of the fourth embodiment in that the tunnel barrier layer B1 is disposed between the semiconductor substrate 1 and the ferromagnetic layer 3 while the tunnel barrier layer B2 is disposed between the semiconductor substrate 1 and the ferromagnetic layer 4. The tunnel barrier layers B1 and B2 have the functions of injecting the carriers having the high spin polarization ratios into the channel 2 to enlarge the change in conductance associated with the changes in magnetization directions of the ferromagnetic layers 3 and 4.

The tunnel barrier layers B1 and B2 also have the barrier functions of preventing the reaction between the semiconductor substrate 1 and the ferromagnetic layers 3 and 4. Therefore, a good junction surface between the semiconductor substrate 1 and the ferromagnetic layers 3 and 4 can be formed to achieve an improvement in the production yield.

One of the tunnel barrier layers B1 and B2 may be omitted. Although the spin transistor of the sixth embodiment includes the anti-ferromagnetic layers AF1 and AF2, the anti-ferromagnetic layers AF1 and AF2 may not be used.

(7) Seventh Embodiment

FIG. 14 is a spin transistor according to a seventh embodiment of the invention.

The spin transistor of the seventh embodiment has the MOSFET structure.

Source/drain diffusion layers D1 and D2 are formed in a surface region of the semiconductor substrate 1. The gate electrode 8 is formed on the channel 2 between the source/drain diffusion layers D1 and D2 while the gate insulator 7 is interposed between the channel 2 and the gate electrode 8.

The ferromagnetic layer 3 is formed on the source/drain diffusion layer D1, and the ferromagnetic layer 4 is formed on the source/drain diffusion layer D2. The ferromagnetic layer 3 is the magnetic pinned layer whose magnetization direction is invariable, and the ferromagnetic layer 4 is the magnetic free layer whose magnetization direction is variable.

The ferromagnetic layer 6 is formed on the ferromagnetic layer 4 with the non-magnetic layer 5 interposed therebetween. The non-magnetic layer 5 may be either an insulating material or a conductive material. The ferromagnetic layer 6 is the magnetic pinned layer whose magnetization direction is invariable.

The electrodes 10, 11, and 12 are formed on the ferromagnetic layers 3 and 6 and the gate electrode 8, and the electrodes 10, 11, and 12 have the functions of protecting the ferromagnetic layers 3 and 6 and the gate electrode 8. In FIG. 10, anti-ferromagnetic layers may be provided between the ferromagnetic layers 3 and 6 and between the electrodes 10 and 12, respectively.

In the seventh embodiment, it is assumed that a magnetoresistive effect element MTJ is formed by the ferromagnetic layers 4 and 6 and the non-magnetic layer 5.

Therefore, the non-magnetic layer 5 may be formed into a tunnel barrier layer.

In the spin transistor of the seventh embodiment, the current flowing between the electrodes 10 and 12 depends on the bias voltage applied between the electrodes 10 and 12 and the relative magnetization directions of the ferromagnetic layers 3, 4, and 6.

In the seventh embodiment, any one of the ferromagnetic layers 3 and 4 may comprise the source side, while the other comprises the drain side.

However, in the ferromagnetic layers 3 and 4, it is necessary to satisfy the following requirement in at least one of the ferromagnetic layers that comprise either the source side or the drain side.

The ferromagnetic layer constituting the source side is made of the ferromagnetic material in which the two minority spin bands are provided, one on the high energy side and the other on the low energy side, and the Fermi level is located on the high energy side of the center of the gap between the two minority spin bands.

The ferromagnetic layer constituting the drain side is made of the ferromagnetic material in which the two minority spin bands are provided, one on the high energy side and the other on the low energy side, and the Fermi level is located on the low energy side of the center of the gap between the two minority spin bands.

Figure 15:
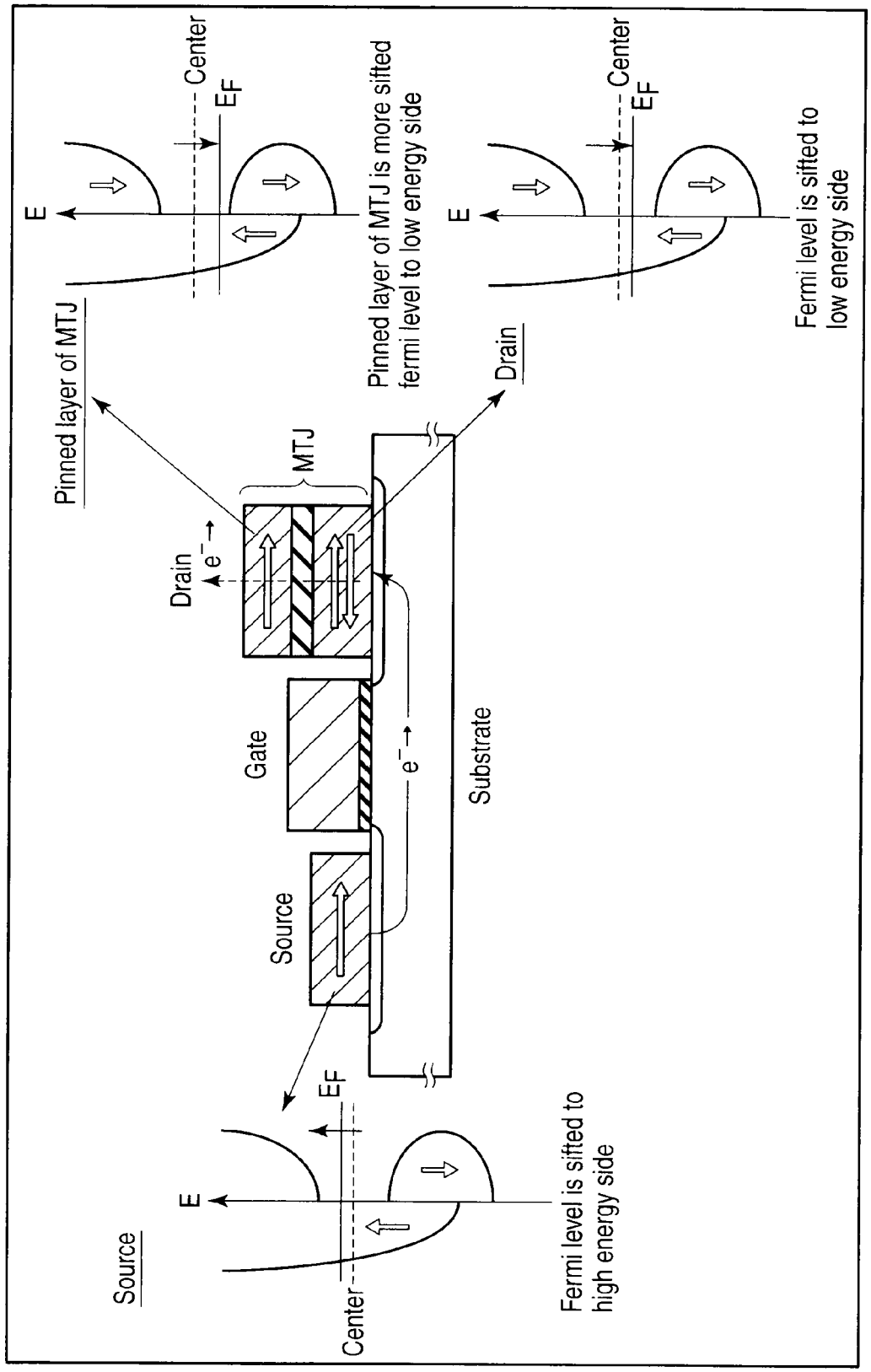
FIG. 15 is a band diagram showing a ferromagnetic material used in the spin transistor of FIG. 14.

FIG. 15 shows an example in which the ferromagnetic layer 3 comprises the source side while the ferromagnetic layer 4 comprises the drain side.

In the example of FIG. 15, for example, the ferromagnetic layer 3 has the Fermi level $E_F$ on the high energy side of the center of the gap between the minority spin bands, and the ferromagnetic layer 4 has the Fermi level $E_F$ on the low energy side of the center of the gap between the minority spin bands.

For the ferromagnetic layer 6, the Fermi level $E_F$ is shifted toward the low energy side from that of the ferromagnetic layer 4.

Therefore the IDP/IDAP ratio can be improved while the bias voltage is applied between the electrodes 10 and 12.

When at least one tunnel barrier layer is formed between the semiconductor substrate 1 and the ferromagnetic material 3 or between the semiconductor substrate 1 and the ferromagnetic material 4, the spin injection efficiency can be enhanced to further improve the performance of the spin transistor.

In the seventh embodiment, the ferromagnetic layers 3, 4, and 6 have the in-plane magnetization. Alternatively, the ferromagnetic layers 3, 4, and 6 may have the perpendicular magnetization.

When the ferromagnetic layers 3, 4, and 6 have the perpendicular magnetization, sometimes the magnetization directions of the ferromagnetic layers 3 4, and 6 are stabilized irrespective of the existence of the anti-ferromagnetic layer.

(8) Eighth Embodiment

Figure 16:
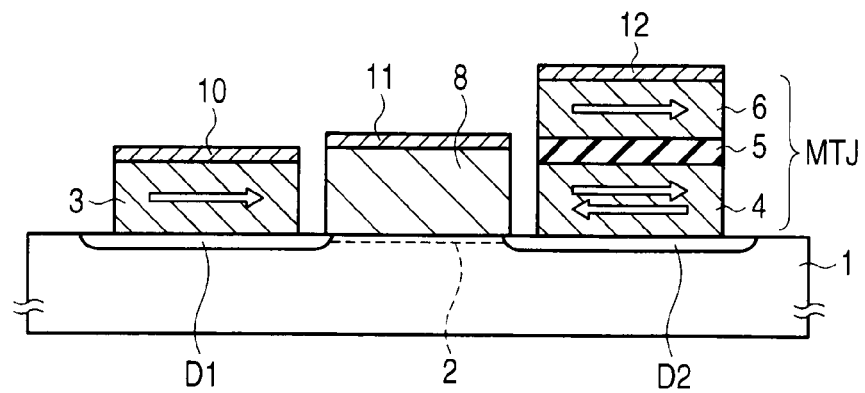
FIG. 16 is a diagram showing a spin transistor of an eighth embodiment.

FIG. 16 is a spin transistor according to an eighth embodiment of the invention.

The spin transistor of the eighth embodiment has the J-FET structure or MESFET structure.

The source/drain diffusion layers D1 and D2 are formed in a surface region of the semiconductor substrate 1. The gate electrode 8 is formed on the channel 2 between the source/drain diffusion layers D1 and D2.

The ferromagnetic layer 3 is formed on the source/drain diffusion layer D1, and the ferromagnetic layer 4 is formed on the source/drain diffusion layer D2. The ferromagnetic layer 3 is the magnetic pinned layer whose magnetization direction is invariable, and the ferromagnetic layer 4 is the magnetic free layer whose magnetization direction is variable.

The ferromagnetic layer 6 is formed on the ferromagnetic layer 4 with the non-magnetic layer 5 interposed therebetween. The non-magnetic layer 5 may be either an insulating material or a conductive material. The ferromagnetic layer 6 is the magnetic pinned layer whose magnetization direction is invariable.

The electrodes 10, 11, and 12 are formed on the ferromagnetic layers 3 and 6 and the gate electrode 8, and the electrodes 10, 11, and 12 have the functions of protecting the ferromagnetic layers 3 and 6 and the gate electrode 8. In FIG. 11, anti-ferromagnetic layers may be provided between the ferromagnetic layers 3 and 6 and between the electrodes 10 and 12, respectively.

In the eighth embodiment, as with the seventh embodiment, it is assumed that the magnetoresistive effect element MTJ is formed by the ferromagnetic layers 4 and 6 and the non-magnetic layer 5.

Therefore, the non-magnetic layer 5 may be formed into a tunnel barrier layer.

In the spin transistor of the eighth embodiment, the current flowing between the electrodes 10 and 12 depends on the bias voltage applied between the electrodes 10 and 12 and the relative magnetization directions of the ferromagnetic layers 3, 4, and 6.

In the eighth embodiment, any one of the ferromagnetic layers 3 and 4 may comprise the source side, while the other comprises the drain side.

However, in the ferromagnetic layers 3 and 4, it is necessary to satisfy the following requirement in at least one of the ferromagnetic layers that comprise either the source side or the drain side.

The ferromagnetic layer constituting the source side is made of the ferromagnetic material in which the two minority spin bands are provided, one on the high energy side and the other on the low energy side and the Fermi level is located on the high energy side of the center of the gap between the two minority spin bands.

The ferromagnetic layer constituting the drain side is made of the ferromagnetic material in which the two minority spin bands are provided, one on the high energy side and the other on the low energy side and the Fermi level is located on the low energy side of the center of the gap between the two minority spin bands.

When the ferromagnetic layer 3 comprises the source side while the ferromagnetic layer 4 comprises the drain side, the ferromagnetic layer 3 has the Fermi level $E_F$ on the high energy side of the center of the gap between the minority spin bands, and the ferromagnetic layer 4 has the Fermi level $E_F$ on the low energy side of the center of the gap between the minority spin bands.

For the ferromagnetic layer 6, the Fermi level $E_F$ is shifted toward the low energy side from that of the ferromagnetic layer 4.

Therefore the IDP/IDAP ratio can be improved while the bias voltage is applied between the electrodes 10 and 12.

When at least one tunnel barrier layer is formed between the semiconductor substrate 1 and the ferromagnetic material 3 or between the semiconductor substrate 1 and the ferromagnetic material 4, the spin injection efficiency can be enhanced to further improve the performance of the spin transistor.

In the eighth embodiment, the ferromagnetic layers 3, 4, and 6 have the in-plane magnetization. Alternatively, the ferromagnetic layers 3, 4, and 6 may have the perpendicular magnetization.

When the ferromagnetic layers 3, 4, and 6 have the perpendicular magnetization, sometimes the magnetization directions of the ferromagnetic layers 3 4, and 6 are stabilized irrespective of the existence of the anti-ferromagnetic layer.

(9) Ninth Embodiment

A ninth embodiment relates to a material used in the devices of the first to eighth embodiments.

For example, Si and Ge can be used as the semiconductor substrate. The conduction type of the semiconductor substrate may be either the n type or the p type. IV, III-V, and II-VI compound semiconductors such as $Si_xGe_{1-x}$ (0<x<1) and a magnetic semiconductor can also be used as the semiconductor substrate.

Preferably the ferromagnetic material used in the ferromagnetic layer has uni-directional anisotropy. Preferably a thickness of the ferromagnetic material used in the ferromagnetic layer ranges from 0.1 nm to 100 nm. The ferromagnetic layer does not become superparamagnetic if the thickness of the ferromagnetic material is of the lower limit. Preferably the thickness of the ferromagnetic material ranges from 0.4 nm to 100 nm in consideration of such condition.

For example, a half metal and a Heusler alloy can be used as the ferromagnetic material. For example, desirably the ferromagnetic material is made of one of $Co_2FeAl_{1-x}Si_x$, $Co_2Mn_{1-x}Fe_xSi$, and $Co_2Cr_{1-x}Fe_xAl$. Ion implantation can be cited as an example of the method for preparing the compositions of the materials.

Any ferromagnetic material can be used as the ferromagnetic material of the invention as long as the position of the Fermi level can be controlled.

The following materials are known as ferromagnetic materials used in a spin transistor, an integrated circuit, and a magnetic memory, and the following materials can be used as the ferromagnetic material of the invention because the position of the Fermi level can be controlled:

Co, Fe, Ni, or an alloy thereof, such as Co—Pt, Co—Fe—Pt, Fe—pt, Co—Fe—Cr—pt, and Co—Cr—P. (X-Y-Z means an alloy containing elements X, Y, and Z) (The same shall apply hereinafter);

alloys such as NiMnSb, Co$_2$MnGe, Co$_2$MnSi, Co$_2$MnSi, and CoCrFeAl;

magnetic semiconductors such as GeMn, SiCNi, SiCMn, SiCFe, ZnMnTe, ZnCrTe, BeMnTe, ZnVO, ZnMrO, ZnCoO, GaMnAs, InMnAs, InMhAb, GaMnP, GaMnN, GaCrN, AlCrN, BiFeTe, SbVTe, PbSnMnTe, GeMhTe, CdMnGeP, ZnSiNMn, ZnGeSiNMn, BeTiFeO, CdMnTe, ZnMnS, TiCoO, SiMh, and SiGeMn.

A magnetic property, crystallinity, a mechanical property, and a chemical property can be adjusted by adding a non-magnetic element such as Ag (silver), Cu (copper), Au (gold), Al (aluminum), Ru (ruthenium), Os (osmium), Re (rhenium), Ta (tantalum), B (boron), C (carbon), O (oxygen), N (nitrogen), Pd (palladium), Pt (platinum), Zr (zirconium), Ir (iridium), W (tungsten), Mo (molybdenum), and Nb (niobium) to the magnetic material.

Examples of the anti-ferromagnetic layer include Fe—Mn (iron-manganese), Pt—Mn (platinum-manganese), Pt—Cr—Mn (platinum-chromium-manganese), Ni—Mn (nickel-manganese), Ir—Mn (iridium-manganese), NiO (nickel oxide), and $Fe_2O_3$ (iron oxide).

Examples of the tunnel barrier layer include Si, Ge, Al, Ga, Mg, and Ti oxide or nitrides, SrTiO, and NdGaO.

Examples of the non-magnetic layer include a material containing at least one of elements of Cu, Cr, Au, Ag, Hf, Zr, Rh, Pt, Ir, and Al, SrTiO, NdGaO, $Si_xGe_{1-x}$ (0<x<1), Si, Ge, Al, Ga, Mg, Ti oxides or nitrides, III-V and II-VI compound semiconductors, and magnetic semiconductors.

5. EXPERIMENTAL EXAMPLE

An experimental example in which a sample of the embodiment was actually prepared to evaluate characteristics of the samples will be described below.

Figure 17:
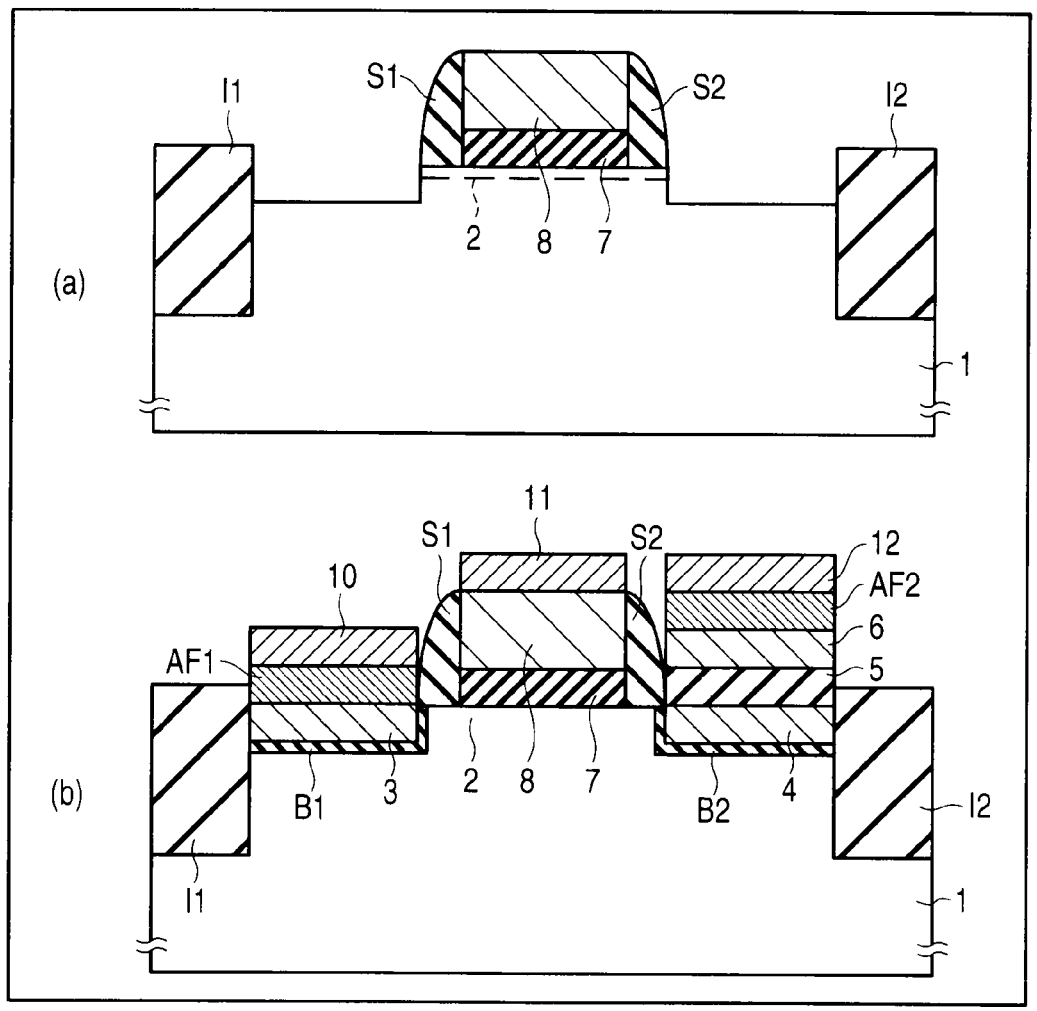
FIG. 17 is a diagram showing a process for producing a sample used in an experimental example.

The sample is the spin transistor produced by the procedure of FIG. 17.

First, the isolation insulating layers I1 and I2 having STI (Shallow Trench Isolation) structures are formed on the semiconductor substrate 1 using a CMOS process. The channel 2 is formed by injecting an impurity into the semiconductor substrate 1 using ion implantation.

A silicon oxide film constituting the gate insulator 7 is grown on the semiconductor substrate 1 by a thermal oxidation method, and a polysilicon film constituting the gate electrode 8 is deposited on the gate insulator 7. An impurity is injected into the polysilicon film, annealing is performed, and patterning is performed on the gate electrode 8 and gate insulator 7 by photolithography and etching. Then sidewall insulators S1 and S2 made of $SiO_2$ are formed using a self-align process.

When reactive ion etching is performed on the semiconductor substrate 1 using the gate electrode 8 and sidewall insulators S1 and S2 as a mask, the recesses are made in the semiconductor substrate 1 to obtain a structure in FIG. 17A.

The tunnel barrier layers B1 and B2 made of $SiO_2$ are formed in the recesses of the semiconductor substrate 1. The ferromagnetic layers 3 and 4 are formed on the tunnel barrier layers B1 and B2 such that the recesses of the semiconductor substrate 1 are filled therewith. At this point, $Co_2FeAl_{0.4}Si_{0.6}$ is used as the material for the ferromagnetic layer 3 because the ferromagnetic layer 3 acts as the source, and $Co_2FeAl_{0.6}Si_{0.4}$ is used as the material for the ferromagnetic layer 4 because the ferromagnetic layer 4 acts as the drain.

The non-magnetic layer 5 and the ferromagnetic layer 6 are formed on the ferromagnetic layer 4, and the anti-ferromagnetic layers AF1 and AF2 are formed on the ferromagnetic layers 3 and 6. The non-magnetic layer 5 is made of Ta (5 nm), and the ferromagnetic layer 6 is made of $(Co_{50}Fe_{50})_{80}B_{20}$ (3 nm). The anti-ferromagnetic layers AF1 and AF2 are made of PtMn (20 nm).

Then, the electrodes 10, 11, and 12 are formed on the anti-ferromagnetic layers AF1 and AF2 and the gate electrode 8 to obtain a structure in FIG. 17B. The electrodes 10, 11, and 12 are made of Al. Annealing is performed to the structure of FIG. 17B at 270° C. for one hour in an even magnetic field of 1 T.

The dependence of IDP and IDAP on Vd is measured for the spin transistor produced by the above-described procedure. The measurement procedure is as follows.

After a voltage that is equal to or more than a threshold voltage (Vth) of the spin transistor is applied to the electrode 11, the magnetic field is scanned to parallelize the relative magnetization directions of the ferromagnetic layers 3 and 4, and the dependence of IDP on Vd is measured. Then the relative magnetization directions of the ferromagnetic layers 3 and 4 are anti-parallelized to measure the dependence of IDAP on Vd.

In the sample, the decrease in the IDP/IDAP ratio is started at Vd of 1.0V.

Then, measurement is performed on a sample that is prepared as a comparative example.

The comparative example is similar to the sample of the embodiment except for the proportions of the ferromagnetic materials used in the ferromagnetic layers 3 and 4.

Specifically, the ferromagnetic layer (source) 3 of the comparative example is made of $Co_2FeAl_{0.5}So_{0.5}$, and the ferromagnetic layer (drain) 4 of the comparative example is made of $Co_2FeAl_{0.5}So_{0.5}$.

When a similar measurement is performed on the comparative example, the decrease in IDP/IDAP ratio is started at Vd of 0.5V.

Accordingly, it is found that the decrease in IDP/IDAP ratio caused by the application of the bias voltage can be suppressed by adjusting the Fermi levels of the source drain electrodes.

6. APPLICATION EXAMPLE

The spin transistors of the embodiments can be applied as follows.

(1) Application to Integrated Circuit

The spin transistors of the embodiments can be applied to an integrated circuit such as a logic LSI. For example, the memory function of the spin transistor can be utilized to selectively use a plurality of logics by one circuit.

FIG. 18 shows an example of the reconfigurable logic circuit.

The logic circuit has a function of prohibiting/permitting passage of an input signal A according to a state of a spin transistor SN1.

The input signal A is fed into a gate end of the N-channel spin transistor SN1, a first power supply potential (for example, ground potential) Vss is applied to a source end through an N-channel MISFET (Metal-Insulator-Semiconductor Field Effect Transistor) N1, and an output end O is connected to a drain end.

A clock signal CL is fed into a gate end of the P-channel MISFET P1, a second power supply potential (for example, positive power supply potential) Vdd that is more than the first power supply potential Vss is applied to a source end, and the output end O is connected to a drain end.

The clock signal CL is fed into a gate end of an N-channel MISFET N1.

The output end O is connected to an input end of a clocked inverter.

The clocked inverter includes P-channel MISFETs P2 and P3 and N-channel MISFETs N2 and N3. The P-channel MISFETs P2 and P3 and the N-channel MISFETs N2 and N3 are connected in series.

The output end O is connected to gate ends (input ends) of the P-channel MISFET P2 and N-channel MISFET N2, and V1 is fed into the gate ends. The clock signal CL is fed into the gate end of the N-channel MISFET N3, an inverted signal bCL of the clock signal CL is fed into a gate end of the P-channel MISFET P3.

As used herein, MISFET shall mean a field effect transistor. A material used in the gate electrode of MISFET is not limited to metal.

FIG. 19 shows operation waveforms when the N-channel spin FET SN1 is in the low-resistance state in the logic circuit of FIG. 18.

When the clock signal CL is in an "L (=0)" state, the P-channel MISFET P3 and the N-channel MISFET N3 are turned off, and the clocked inverter is in a non-operating state. The P-channel MISFET P1 is turned on, the output end O is charged, and V1 becomes an "H (=1)" state. At this point, the input signal A is in the not-fed state ("L"), and the N-channel MISFET N1 is turned off. Therefore, a flow-through current is not generated.

When the clock signal CL is changed from the "L" state to the "H" state, the P-channel MISFET P1 is turned off, the charge of the output end O is ended, and the clocked inverter enters an operating state. The N-channel MISFET N1 is turned on. Therefore, when the input signal A is fed while the clock signal CL is in the "H" state, the value of V1 is determined according to the value of the input signal A.

For example, in FIG. 19, when the input signal A is in the "H" state, because charges of the output end O are rapidly discharged to the first power supply potential Vss through the N-channel spin FET SN1, V1 is changed from the "H" state to the "L" state. On the other hand, when the input signal A is in the "L" state, V1 is maintained in the "H" state.

Thus, in the N-channel spin FET SN1 that is in the low-resistance state, an output signal Z of the clocked inverter enters the "H" state when the input signal A is in the "H" state, and the output signal Z of the clocked inverter enters the "L" state when the input signal A is in the "L" state.

When the clock signal CL is in the "L" state, the output signal Z of the clocked inverter is not influenced by the value of V1, but the output signal Z of the clocked inverter is maintained in the state immediately before the clock signal CL in the "H" state.

Figure 20:
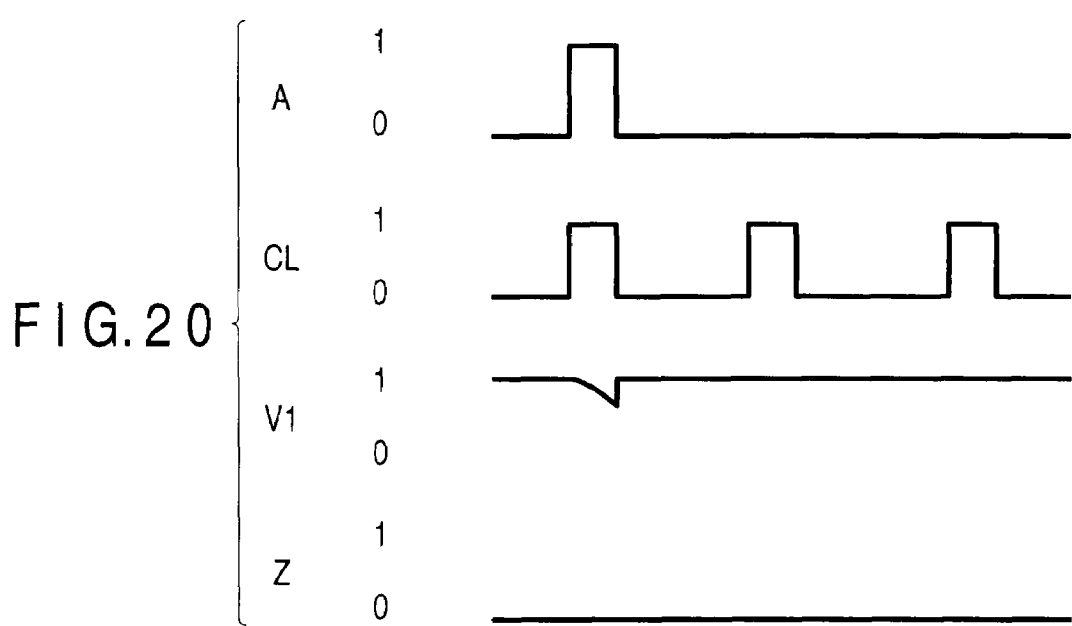

FIG. 20 shows operation waveforms when the N-channel spin FET SN1 is in the high-resistance state in the logic circuit of FIG. 18.

When the clock signal CL is in an "L (=0)" state, the P-channel MISFET P3 and the N-channel MISFET N3 are turned off, and the clocked inverter is in the non-operating state. The P-channel MISFET P1 is turned on, the output end O is charged, and V1 becomes the "H (=1)" state. At this point, the input signal A is in the not-fed state ("L"), and the N-channel MISFET N1 is turned off. Therefore, the flow-through current is not generated.

When the clock signal CL is changed from the "L" state to the "H" state, the P-channel MISFET P1 is turned off, the charge of the output end O is ended, and the clocked inverter becomes the operating state. The N-channel MISFET N1 is turned on. Therefore, in the N-channel spin FETS N1 that is in the high-resistance state, even if the input signal A is fed while the clock signal CL is in the "H" state, the value of V1 cannot be changed according to the value of the input signal A.

That is, when the input signal A is in the "H" state, an on-resistance (resistance value between the source end and the drain end) of the N-channel spin FET SN1 is remarkably large, although the N-channel spin FET SN1 is turned on. Therefore, the speed at which the charges of the output end O are discharged to the first power supply potential Vs through the N-channel spin FET SN1 is delayed. Therefore, V1 is maintained in the "H" state irrespective of the input signal A when a period of the clock signal CL is set such that the clock signal CL is returned from the "H" state to the "L" state before a potential at V1 is lower than a circuit threshold of the subsequent clocked inverter.

Thus, when the N-channel spin FET SN1 is in the high-resistance state, the output signal Z of the clocked inverter always enters the "L" state to prohibit the passage of the input signal A.

As to the timing at which the input signal A is fed, because the N-channel MISFET N1 is turned off to prevent the flow-through current when the P-channel MISFET P1 is turned on (during charge), the input signal A can be given to the gate end of the N-channel spin FET SN1 before the N-channel MISFET N1 is turned on to start the discharge.

For example, the input signal A is given to the gate end of the N-channel spin FET SN1 before N-channel MISFET N1 is turned on to start the discharge after the P-channel MISFET P1 is turned on to start the charge.

As described above, in the application to an integrated circuit, the function of permitting/prohibiting the passage of the input signal can be restructured by the data written in the N-channel spin FET, and the reconfigurable logic circuit in which the flow-through current is not generated in normal operation can be realized.

The magnetized state of the N-channel spin FET is retained in the nonvolatile manner even after the power is turned off, so that the same operation can be performed when the power is turned on again.

(2) Application to Magnetic Memory

The case in which the spin transistors of the embodiments are applied to a magnetic memory will be described below.

The spin transistors of the embodiments can be applied as a memory cell of the magnetic memory.

FIG. 21 shows an example of the magnetic memory in which the spin transistor is used.

The memory cell array includes a spin transistor SM. For example, one memory cell includes one spin transistor SM. One of the source and drain of the spin transistor SM is connected to a bit line BL(L), and the other is connected to a bit line BL(R). The bit lines BL(L) and BL(R) are extended in the same direction, that is, in the column direction.

A CMOS type driver/sinker DS1 is connected to one of ends of the bit line BL(L). The driver/sinker DS1 includes the P-channel MOS transistor P1 and the N-channel MOS transistor N1. The P-channel MOS transistor P1 and the N-channel MOS transistor N1 are connected in series between the power supply terminals Vdd and Vss to control generation/cut-off of a spin injection current Is.

One of the ends of the bit line BL(L) is connected to a connection point of the MOS transistors P1 and N1, the control signal A is fed into the gate of the P-channel MOS transistor P1, and a control signal C is fed into a gate of the N-channel MOS transistor N1.

The other end of the bit line BL(L) is connected to a sense amplifier S/A through an N-channel MOS transistor ST1 that is of a column selection switch. The sense amplifier S/A includes, for example, a differential amplifier, and determines the value of the data stored in the spin transistor SM based on a reference voltage Vref.

An output signal of the sense amplifier S/A becomes read data DATA of the selected spin transistor SM.

A control signal $\phi j$ is a column selection signal for selecting a column j, and is fed into the gate of the N-channel MOS transistor ST1.

A CMOS type driver/sinker DS2 is connected to one of ends of the bit line BL(R). The driver/sinker DS2 includes the P-channel MOS transistor P2 and the N-channel MOS transistor N2. The P-channel MOS transistor P2 and the N-channel MOS transistor N2 are connected in series between the power supply terminals Vdd and Vss to control the generation/cut-off of the spin injection current Is.

One of the ends of the bit line BL(R) is connected to a connection point of the MOS transistors P2 and N2, a control signal B is fed into the gate of the P-channel MOS transistor P2, and a control signal D is fed into a gate of the N-channel MOS transistor N2.

An N-channel MOS transistor NE is connected between the other end of the bit line BL(R) and the power supply terminal Vss, and the N-channel MOS transistor NE is turned on in reading the data. A control signal E is a row selection signal for selecting a row i, and the control signal E is fed into the gate of the MOS transistor NE.

In the magnetic memory, when the spin transistor SM that is of the memory cell is the N-channel type, the data is written in a magnetic recording portion of the spin transistor SM as follows.

In cases where the data of "0" is written, a control signal Wi is set to the "H" state, the control signals A and C are set to the "L" state, the control signals B and D are set to the "H" state, and the spin injection current Is is passed from the driver/sinker DS1 toward the driver/sinker DS2.

In cases where the data of "1" is written, the control signal Wi is set to the "H" state, the control signals A and C are set to the "H" state, the control signals B and D are set to the "L" state, and the spin injection current Is is passed from the driver/sinker DS2 toward the driver/sinker DS1.

In reading the data, the control signal Wi is set to the "H" state, the control signals A and B are set to the "H" state, the control signals C and D are set to the "L" state, the control signals E and φj are set to the "H" state, and the read current is passed from the sense amplifier S/A toward the MOS transistor NE through the spin FET.

The read current is set smaller than the spin injection current to prevent the generation of false write in reading the data.

(3) The Case in which a Spin Transistor is Mounted on a Chip to form a System.

A system mounted on one chip can be formed by the spin transistors of the embodiments. In such cases, the system can be combined with a magnetic memory.

FIG. 22 shows an example of a magnetic memory.

The spin transistors of the embodiments are used in a peripheral circuit of the magnetic memory. Examples of the memory cell array include an MRAM (Magnetic Random Access Memory), FeRAM (Ferroelectric Random Access Memory), and flash memory (NAND type and NOR type). The spin transistors of the embodiments may be used as the memory cell in the memory cell array.

FIG. 23 shows an example of the system LSI.

The system LSI includes an SoC (System on Chip).

For example, the spin transistors of the embodiments are used in a logic circuit constituting the system LSI. A CPU (Central Processing Unit) may be formed by a normal CMOS circuit or the spin transistors of the embodiments.

In addition to a nonvolatile semiconductor memory such as a flash memory, the semiconductor memory in which the spin transistors of the embodiments are used as the memory cell and the magnetic memories of the embodiments can be used as a ROM (Read Only Memory).

A RAM (Random Access Memory) is formed by a memory such as SRAM and DRAM in which high-speed operation can be performed.

FIG. 24 shows an example of a memory embedded logic LSI.

The spin transistors of the embodiments are used in the logic circuit. In addition to the normal semiconductor memory, the semiconductor memory in which the spin transistors of the embodiments are used as the memory cell and the magnetic memories of the embodiments can be used as the memory circuit.

When a neuron-type circuit is formed by the spin transistors of the embodiments, a flexible memory system similar to that in a brain function can be structured.

(4) Other

The spin transistors of the embodiments can further be applied and modified as follows. For example, the spin transistors of the embodiments can be applied to both an enhancement channel type and a depression channel type. In a method for producing the channel, a modulation-doped hetero-interface growth process may be adopted in addition to ion implantation. Further, the spin transistor may be formed by epitaxial growth of the semiconductor material on an incline substrate.

In cases where the spin transistors of the embodiments are applied to the reconfigurable logic circuit of FIG. 18, the data can be written in the spin transistor using the same circuit as the driver/sinkers DS1 and DS2 in the magnetic memory of FIG. 21.

7. CONCLUSION

According to the invention, the deterioration of the IDP/IDAP ratio can be prevented when a finite bias voltage is applied between the source and drain electrodes of the spin transistor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin transistor comprising:
a first ferromagnetic layer;
a second ferromagnetic layer;
a semiconductor layer between the first and second ferromagnetic layers; and
a gate electrode on or above a surface of the semiconductor layer, the surface being between the first and second ferromagnetic layers,
wherein one of the first and second ferromagnetic layers has an invariable magnetization and the other has a variable magnetization,
wherein data are stored by a relation of magnetization directions of the first and second ferromagnetic layers,
wherein electrons flow from the first ferromagnetic layer to the second ferromagnetic layer in a read operation, and
wherein the first ferromagnetic layer comprises a ferromagnet which has a first minority spin band located at a high energy side and a second minority spin band located at a low energy side, and has a Fermi level in an area of the high energy side higher than a middle of a gap between the first and second minority spin bands.

2. The transistor according to claim 1,
wherein the first ferromagnetic layer has an invariable magnetization and the second ferromagnetic layer has a variable magnetization.

3. The transistor according to claim 1,
wherein the first ferromagnetic layer has a variable magnetization and the second ferromagnetic layer has an invariable magnetization.

4. The transistor according to claim 1,
wherein the ferromagnet includes one of $Co_2FeAl_{1-x}Si_x$ (1>x>0.5), $Co_2Mn_{1-x}Fe_xSi$ (1>x>0.5) and $Co_2Cr_{1-x}Fe_xAl$ (1>x>0.4).

5. The transistor according to claim 1,
wherein the ferromagnet is a half metal.

6. The transistor according to claim 1,
wherein the ferromagnet includes $X_2YZ$, X is at least one of Fe, Co, Ni, Cu, Zn, Ru, Rh, Pd, Ag, Cd, Ir, Pt and Au, Y is at least one of Ti, V, Cr, Mn and Fe, and Z is at least one of Al, Ga, Si, Ge and Sn,
wherein Y has a composition ratio in which the number of electrons in the ferromagnet is larger than the number of electrons in the ferromagnet when the Fermi level is located at the middle of the gap.

7. The transistor according to claim 1,
wherein the ferromagnet includes $X_2YZ$, X is at least one of Fe, Co, Ni, Cu, Zn, Ru, Rh, Pd, Ag, Cd, Ir, Pt and Au, Y is at least one of Ti, V, Cr, Mn and Fe, and Z is at least one of Al, Ga, Si, Ge and Sn,
wherein Z has a composition ratio in which the number of electrons in the ferromagnet is larger than the number of electrons in the ferromagnet when the Fermi level is located at the middle of the gap.

8. The transistor according to claim 1, further comprising:
a tunnel barrier layer which is provided at least one of between the first ferromagnetic layer and the semiconductor layer and between the second ferromagnetic layer and the semiconductor layer.

9. An integrated circuit comprising the transistor according to claim 1.

10. A magnetic memory comprising a memory cell including the transistor according to claim 1.

11. A spin transistor comprising:
a first ferromagnetic layer;
a second ferromagnetic layer;
a semiconductor layer between the first and second ferromagnetic layers; and
a gate electrode on or above a surface of the semiconductor layer, the surface being between the first and second ferromagnetic layers,
wherein one of the first and second ferromagnetic layers has an invariable magnetization and the other has a variable magnetization,
wherein data are stored by a relation of magnetization directions of the first and second ferromagnetic layers,
wherein electrons flow from the first ferromagnetic layer to the second ferromagnetic layer in a read operation, and
wherein the first ferromagnetic layer comprises a ferromagnet which has a first minority spin band located at a high energy side and a second minority spin band located at a low energy side, and has a Fermi level in an area of the high energy side higher than a middle of a gap between the first and second minority spin bands, and
the second ferromagnetic layer comprises a ferromagnet which has a third minority spin band located at a high energy side and a fourth minority spin band located at a low energy side, and has a Fermi level in an area of the low energy side lower than a middle of a gap between the third and fourth minority spin bands.

* * * * *